(12) United States Patent
Huang et al.

(10) Patent No.: US 11,239,325 B2
(45) Date of Patent: Feb. 1, 2022

(54) SEMICONDUCTOR DEVICE HAVING BACKSIDE VIA AND METHOD OF FABRICATING THEREOF

(71) Applicant: Taiwan Semiconductor Manufacturing Co., Ltd., Hsinchu (TW)

(72) Inventors: Lin-Yu Huang, Hsinchu (TW); Li-Zhen Yu, New Taipei (TW); Chia-Hao Chang, Hsinchu (TW); Cheng-Chi Chuang, New Taipei (TW); Kuan-Lun Cheng, Hsin-Chu (TW); Chih-Hao Wang, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/948,712

(22) Filed: Sep. 29, 2020

(65) Prior Publication Data

US 2021/0336012 A1 Oct. 28, 2021

Related U.S. Application Data

(60) Provisional application No. 63/016,686, filed on Apr. 28, 2020.

(51) Int. Cl.
*H01L 29/40* (2006.01)
*H01L 29/417* (2006.01)
*H01L 29/423* (2006.01)
*H01L 29/66* (2006.01)
*H01L 29/78* (2006.01)
*H01L 29/06* (2006.01)

(52) U.S. Cl.
CPC ...... *H01L 29/401* (2013.01); *H01L 29/41791* (2013.01); *H01L 29/4236* (2013.01); *H01L 29/66818* (2013.01); *H01L 29/785* (2013.01); *H01L 29/0673* (2013.01); *H01L 29/42392* (2013.01); *H01L 2029/7858* (2013.01)

(58) Field of Classification Search
CPC ............. H01L 29/401; H01L 29/785; H01L 29/41791; H01L 29/66818; H01L 29/4236; H01L 2029/7858; H01L 29/4175; H01L 29/41766; H01L 29/42392; H01L 29/0673
See application file for complete search history.

(56) References Cited

U.S. PATENT DOCUMENTS 5,666,002 A * 9/1997 Yamamoto ........ H01L 27/10808
257/309
5,869,867 A * 2/1999 Takeuchi .......... H01L 29/78648
257/347

(Continued)

*Primary Examiner* — Earl N Taylor
(74) *Attorney, Agent, or Firm* — Haynes and Boone, LLP

(57) ABSTRACT

Structures and methods that include a device such as a gate-all-around transistor formed on a frontside and a contact to one terminal of the device from the frontside of the structure and one terminal of the device from the backside of the structure. The backside contact may include selectively etching from the backside a first trench extending to expose a first source/drain structure and a second trench extending to a second source/drain structure. A conductive layer is deposited in the trenches and patterned to form a conductive via to the first source/drain structure.

20 Claims, 36 Drawing Sheets

(56) References Cited

U.S. PATENT DOCUMENTS

| | | | | |
|---|---|---|---|---|
| 6,600,173 B2* | 7/2003 | Tiwari | H01L 21/76254 | 257/347 |
| 6,921,961 B2* | 7/2005 | Sanchez | H01L 21/84 | 257/532 |
| 7,402,866 B2* | 7/2008 | Liang | H01L 29/41766 | 257/347 |
| 7,825,472 B2* | 11/2010 | Park | H01L 27/0688 | 257/351 |
| 9,029,949 B2* | 5/2015 | Gambino | H01L 27/1203 | 257/347 |
| 9,543,397 B2* | 1/2017 | Kleemeier | H01L 29/41766 | |
| 10,367,070 B2* | 7/2019 | Morrow | H01L 29/0847 | |
| 10,420,171 B2* | 9/2019 | Goktepeli | H01L 21/84 | |
| 10,847,615 B2* | 11/2020 | Yabe | H01L 21/743 | |
| 10,872,820 B2* | 12/2020 | Block | H01L 21/30625 | |
| 10,886,217 B2* | 1/2021 | Morrow | H01L 27/0886 | |
| 11,094,782 B1* | 8/2021 | Trivedi | H01L 29/78696 | |
| 11,101,318 B2* | 8/2021 | Kumar | H01L 27/222 | |
| 2002/0025604 A1* | 2/2002 | Tiwari | H01L 25/50 | 438/118 |
| 2006/0115943 A1* | 6/2006 | Koyanagi | H01L 29/78648 | 438/197 |
| 2007/0267698 A1* | 11/2007 | Bernstein | H01L 27/1203 | 257/347 |
| 2007/0267723 A1* | 11/2007 | Bernstein | H01L 27/0688 | 257/621 |
| 2007/0296002 A1* | 12/2007 | Liang | H01L 21/84 | 257/288 |
| 2014/0332749 A1* | 11/2014 | Yokoyama | H01L 21/845 | 257/4 |
| 2015/0235940 A1* | 8/2015 | Chen | H01L 23/5226 | 257/759 |
| 2016/0087059 A1* | 3/2016 | Hsieh | H01L 29/41741 | 257/329 |
| 2016/0190312 A1* | 6/2016 | Zhang | H01L 29/7827 | 257/192 |
| 2018/0006126 A1* | 1/2018 | Hook | H01L 21/84 | |
| 2018/0175034 A1* | 6/2018 | Goktepeli | H01L 21/76895 | |
| 2019/0097592 A1* | 3/2019 | Goktepeli | H04B 15/005 | |
| 2019/0157310 A1* | 5/2019 | Glass | H01L 21/845 | |
| 2019/0259699 A1* | 8/2019 | Morrow | H01L 23/528 | |
| 2020/0013900 A1* | 1/2020 | Carr | H01L 21/76864 | |
| 2020/0211905 A1* | 7/2020 | Huang | H01L 29/42356 | |
| 2020/0303509 A1* | 9/2020 | Mehandru | H01L 29/0847 | |
| 2021/0280683 A1* | 9/2021 | Trivedi | H01L 29/66795 | |

* cited by examiner

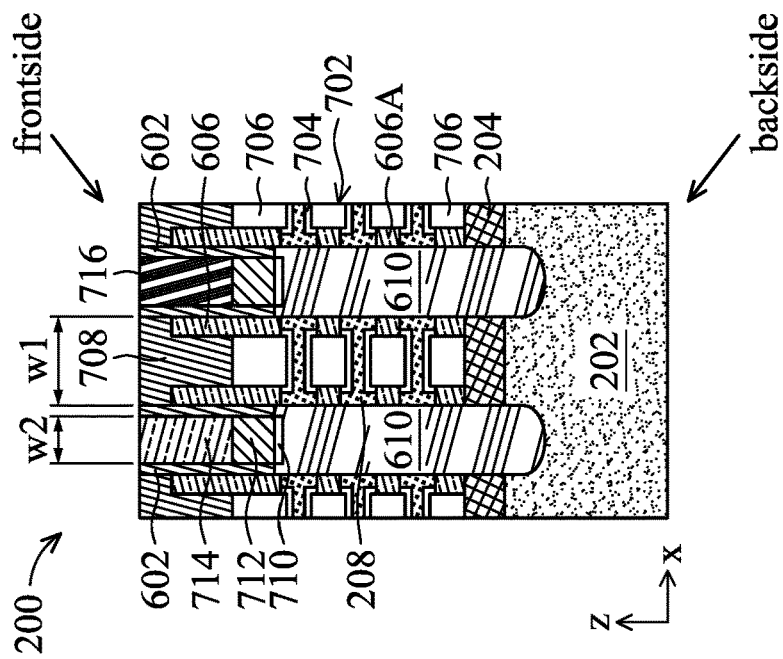
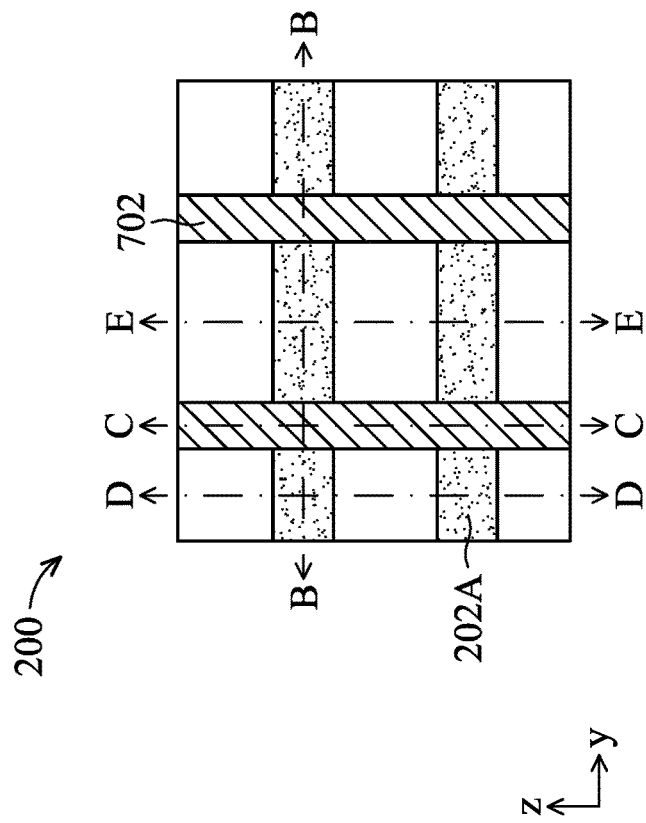
FIG. 7B
FIG. 7A

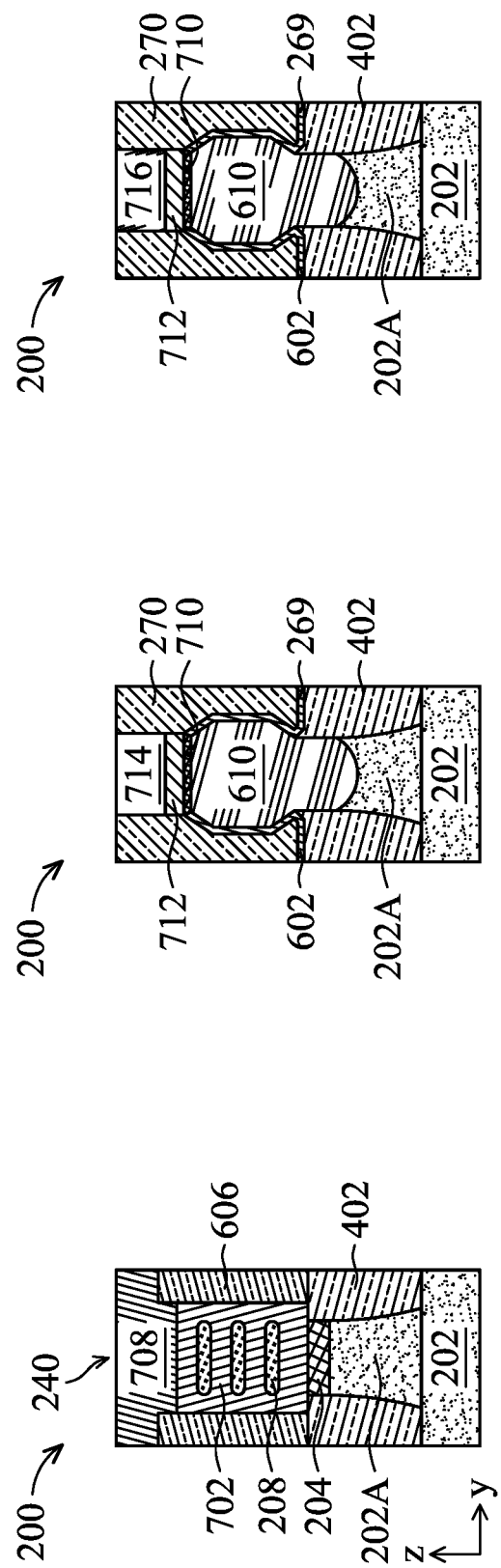

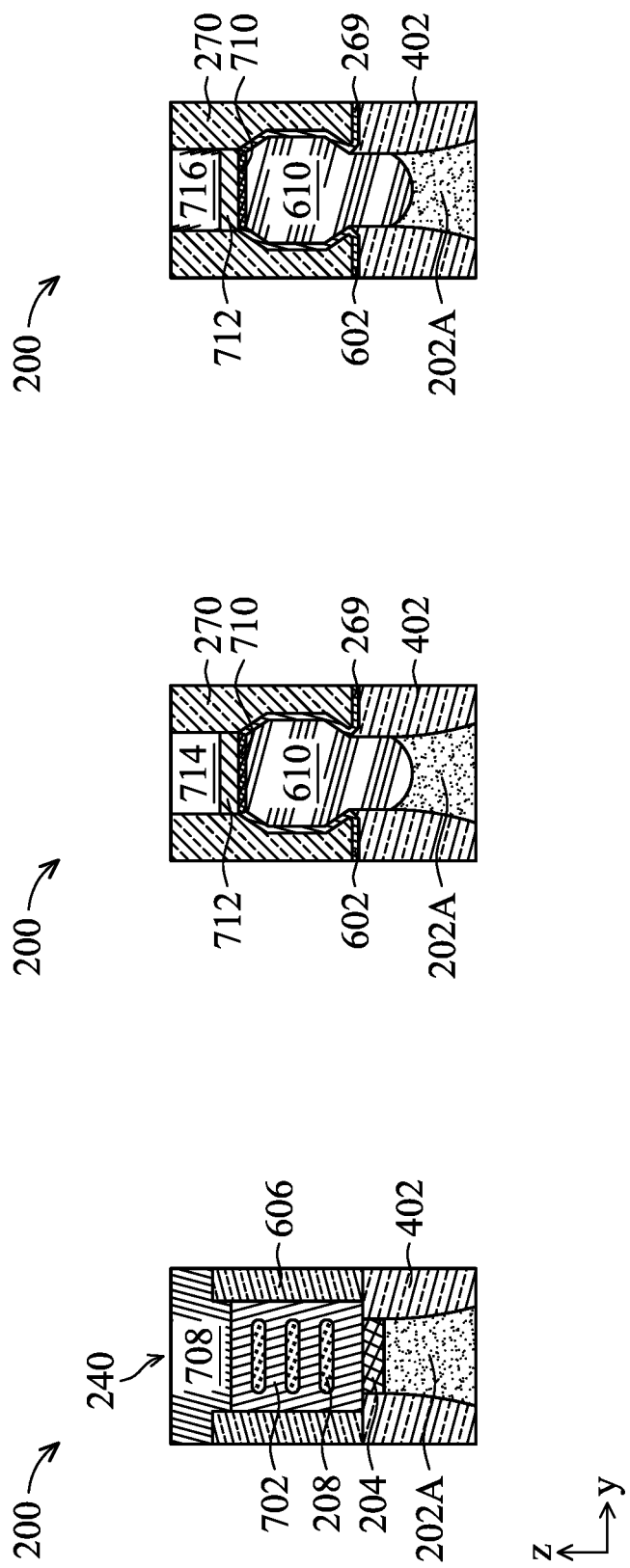

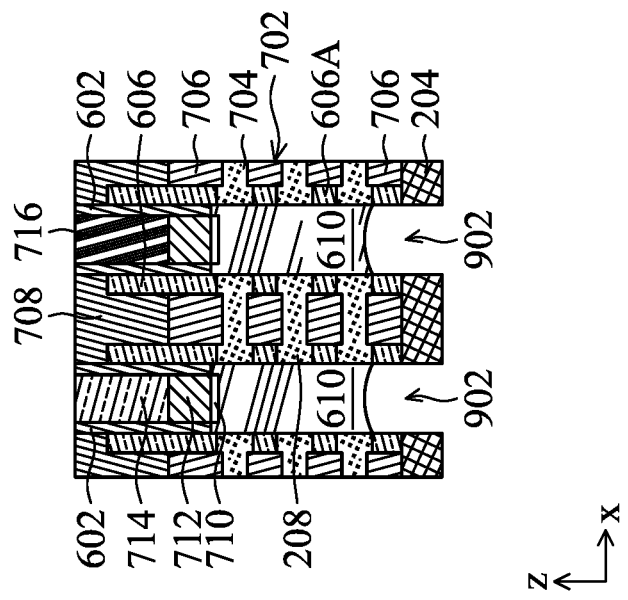
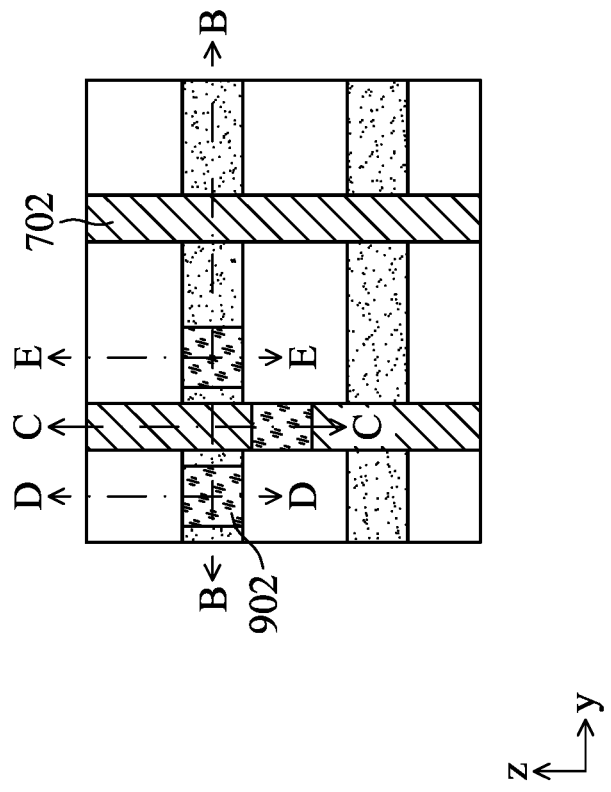
FIG. 9B
FIG. 9A

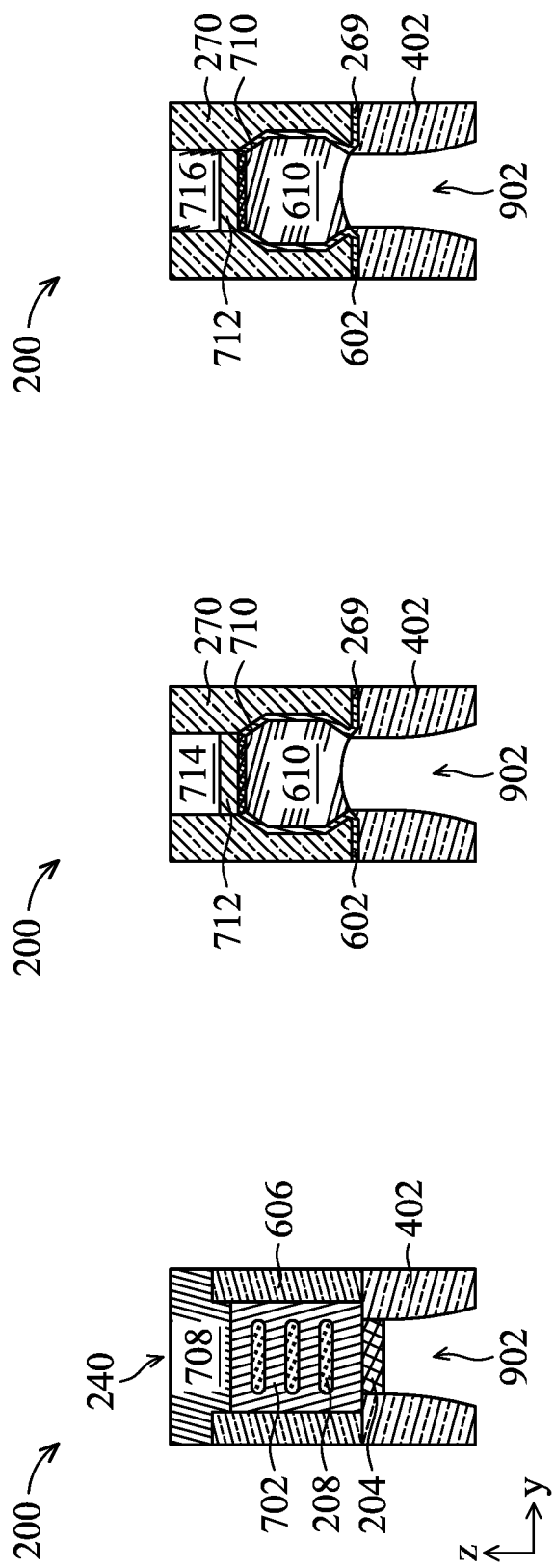

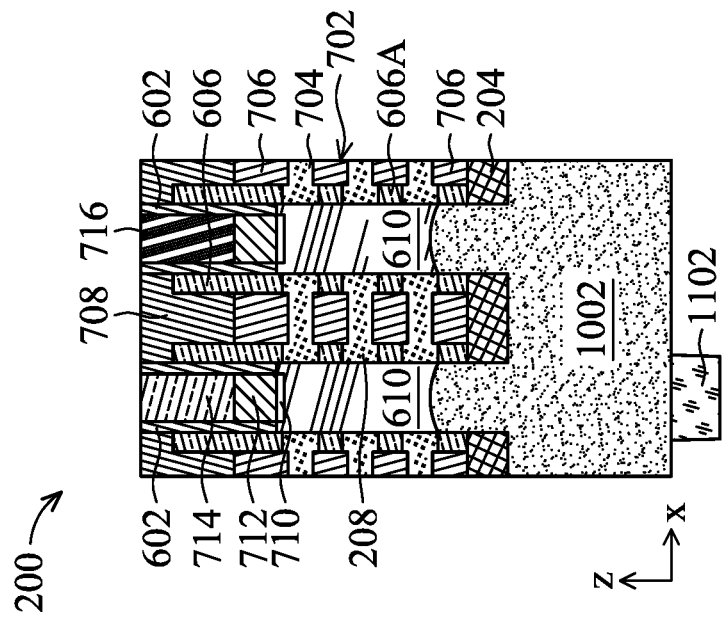
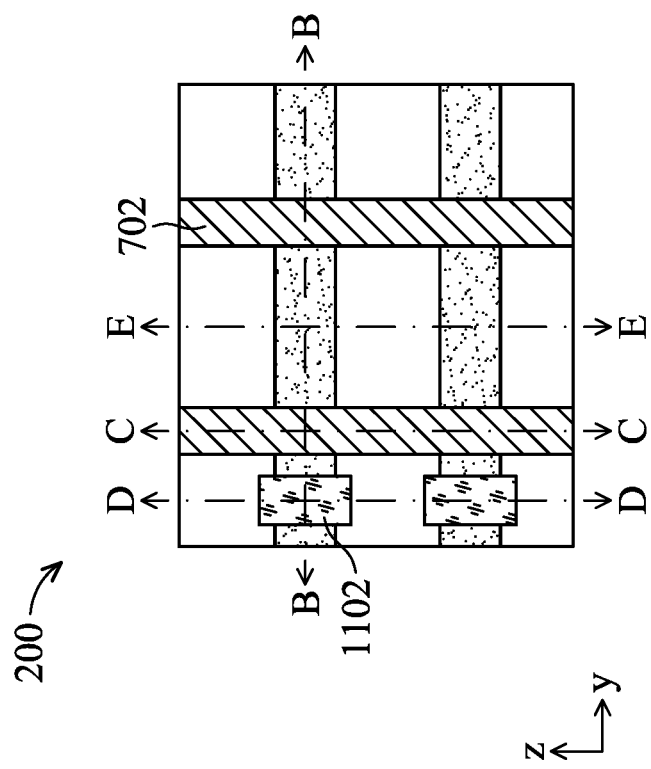
FIG. 11B
FIG. 11A

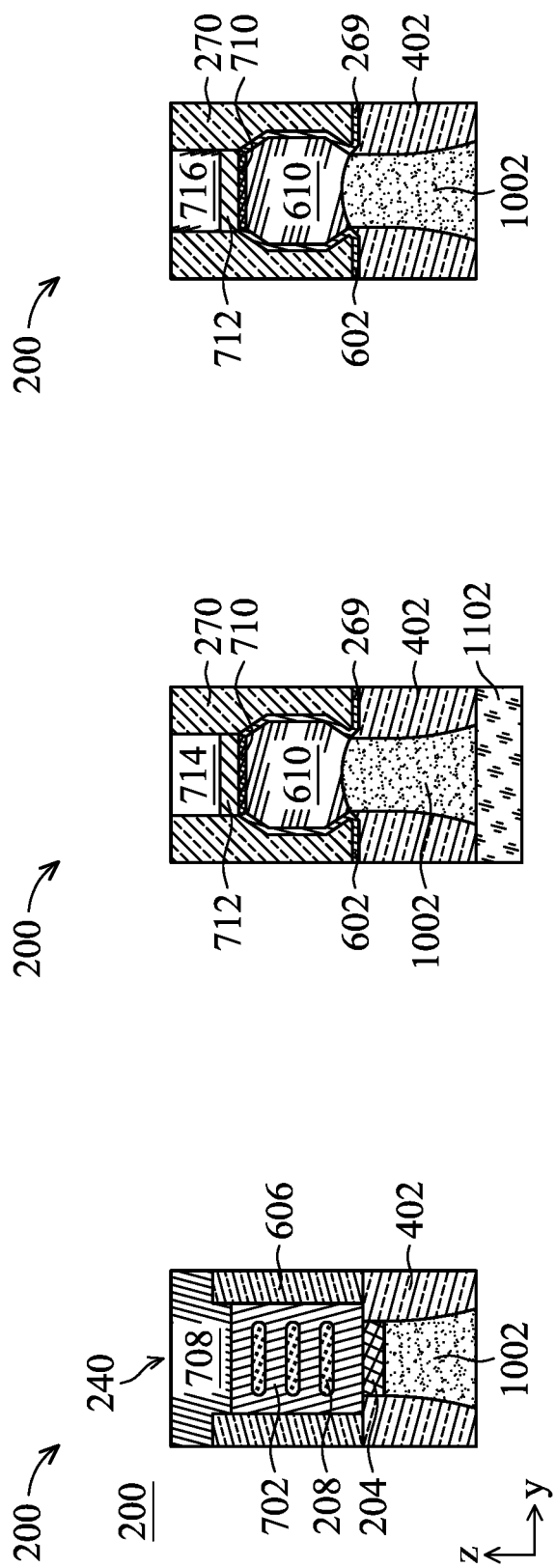

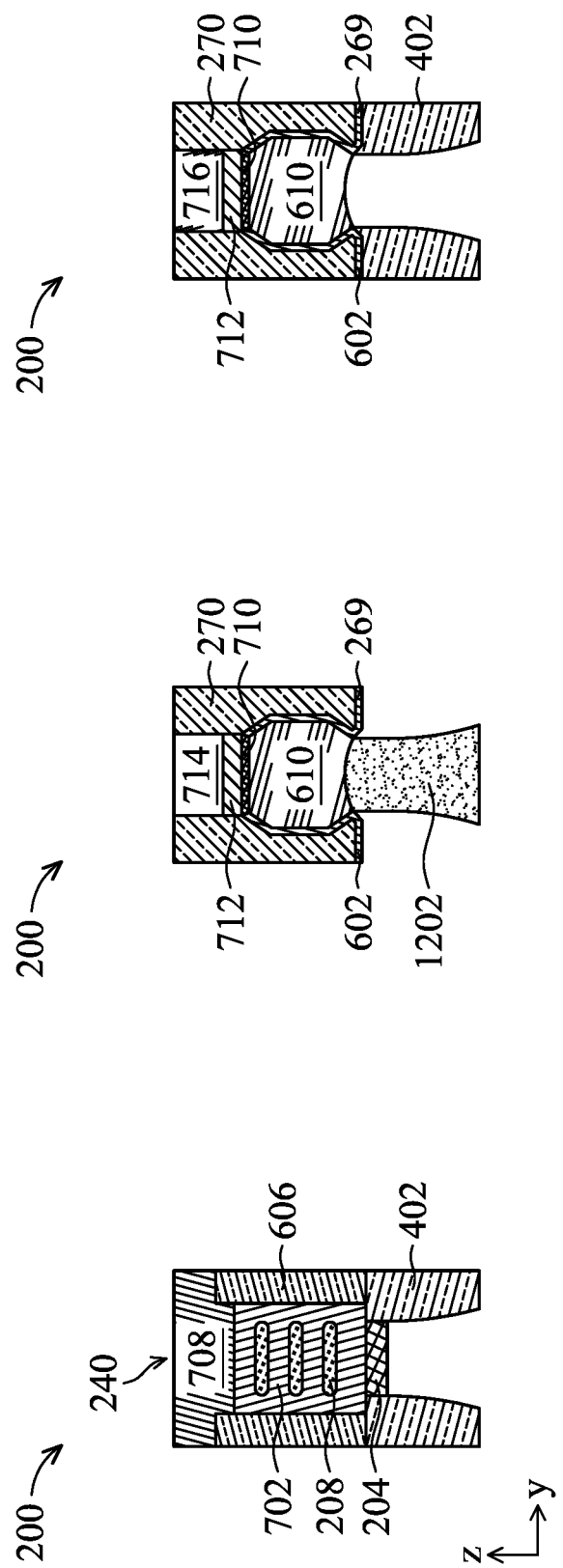

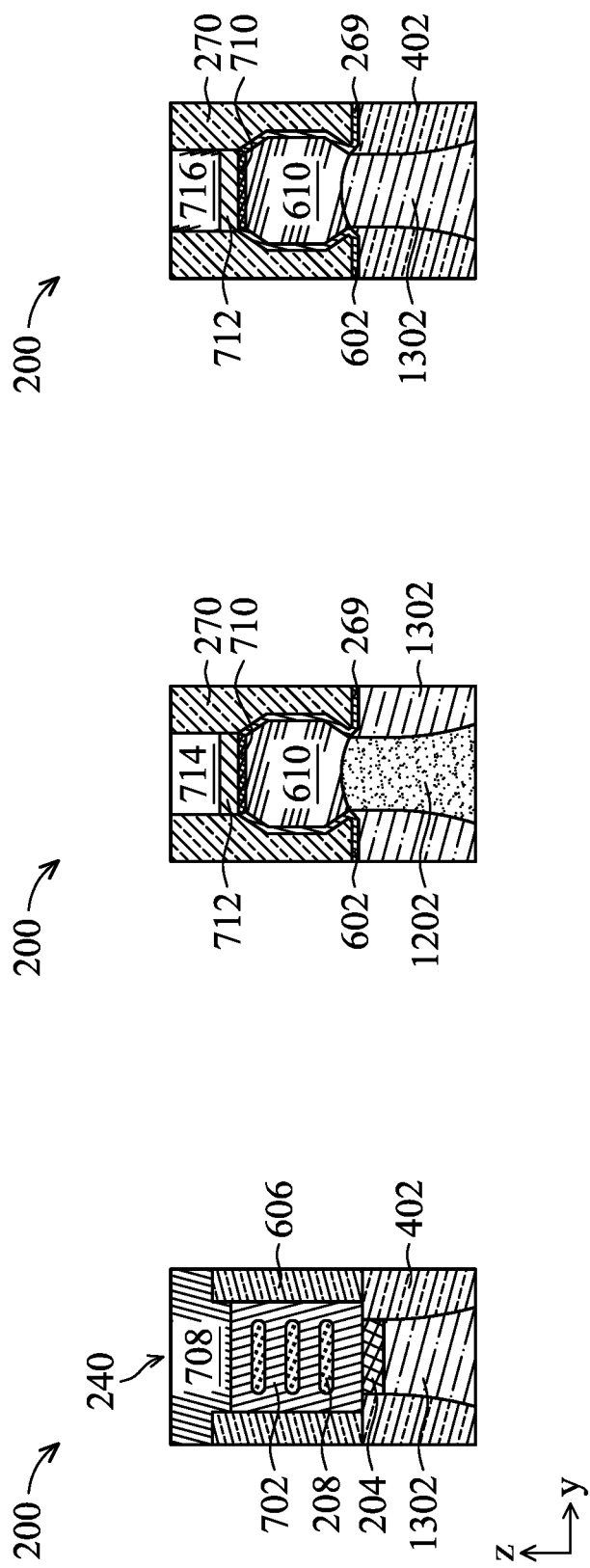

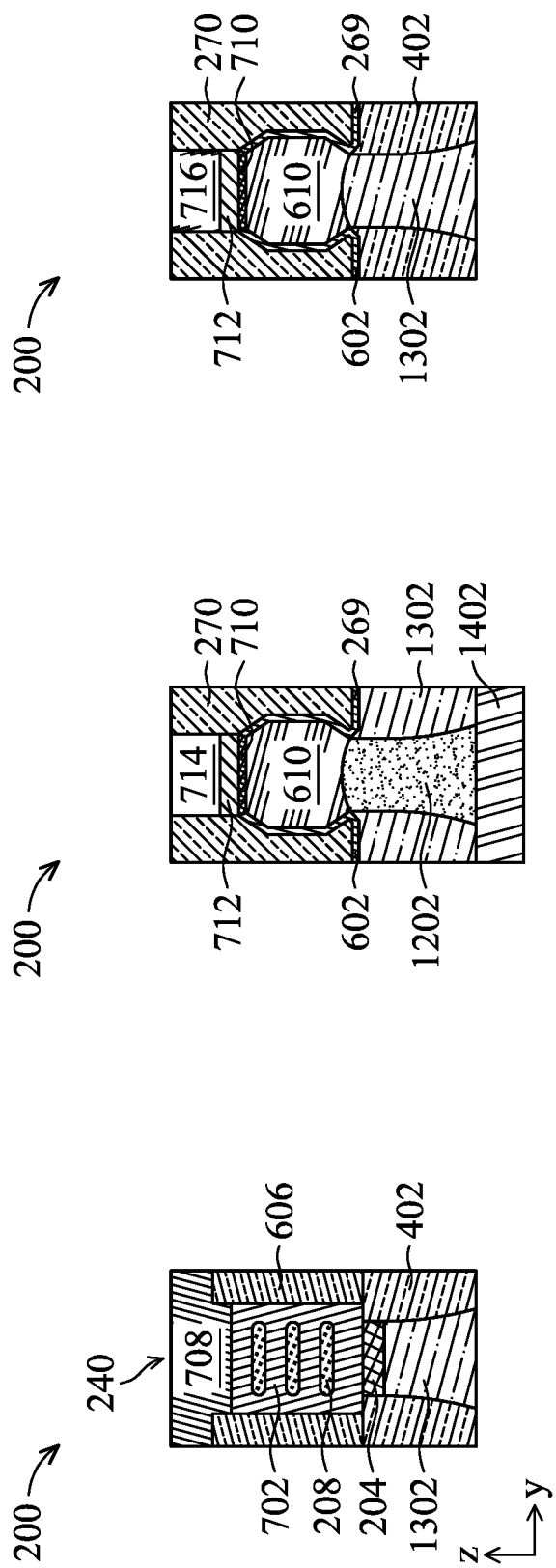

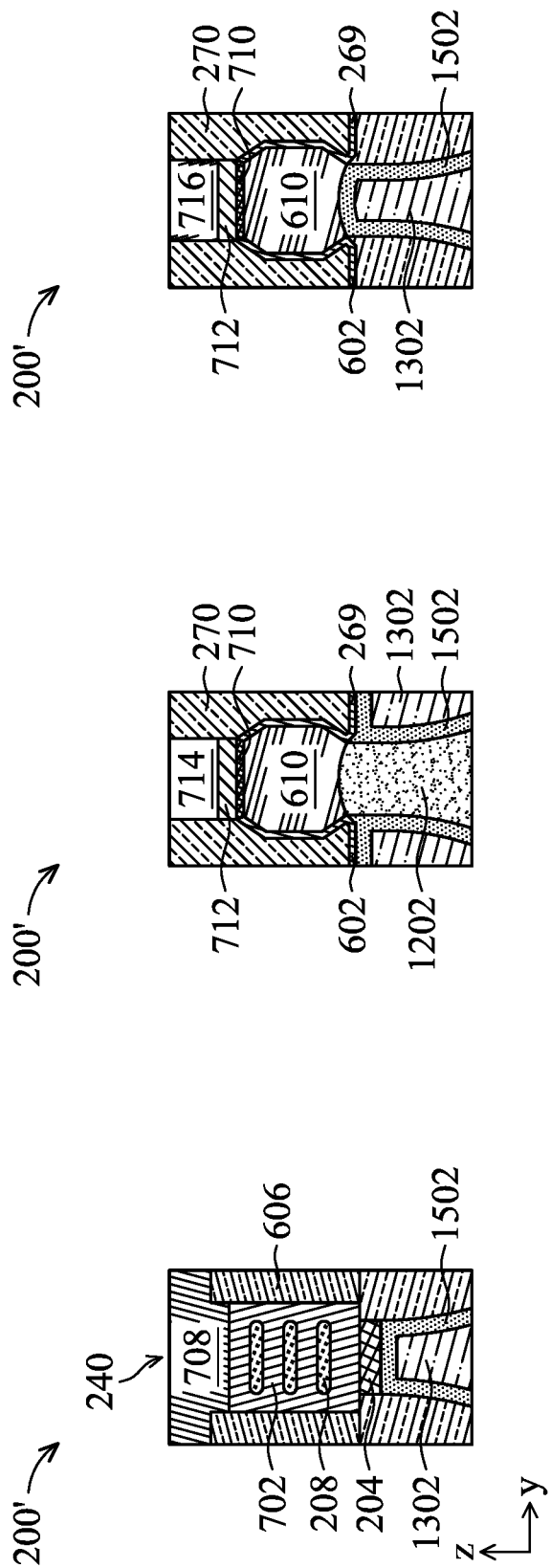

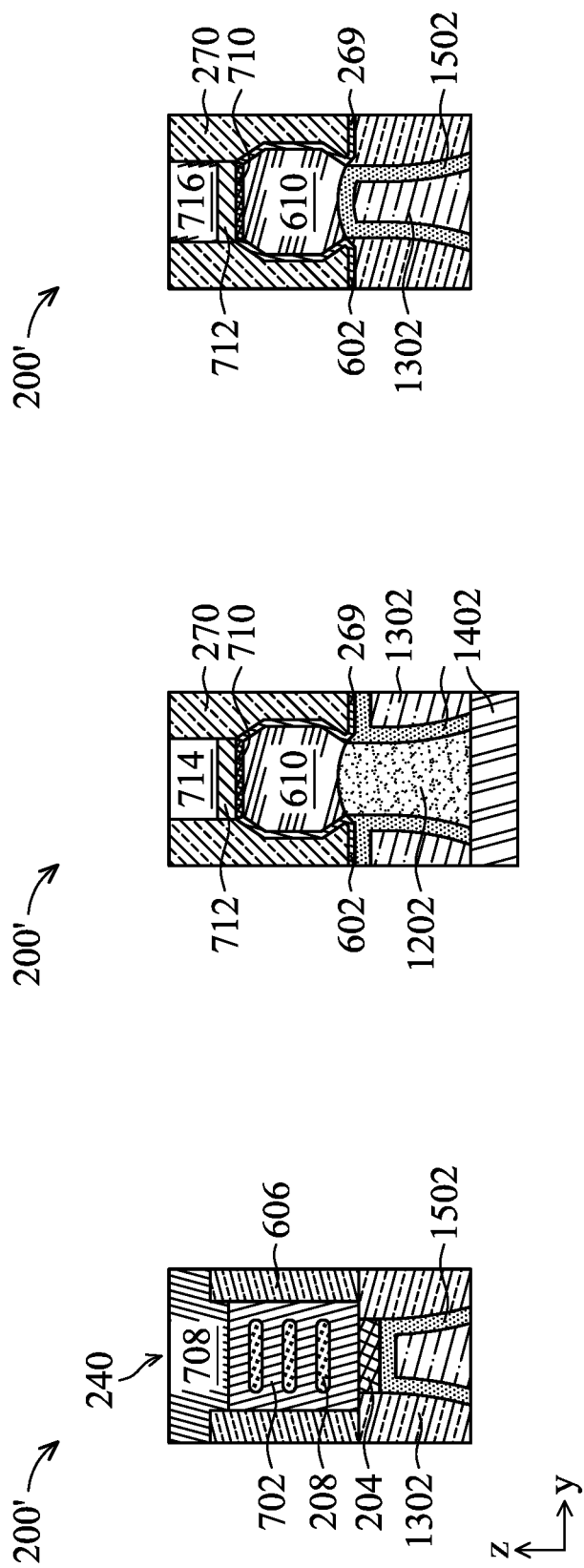

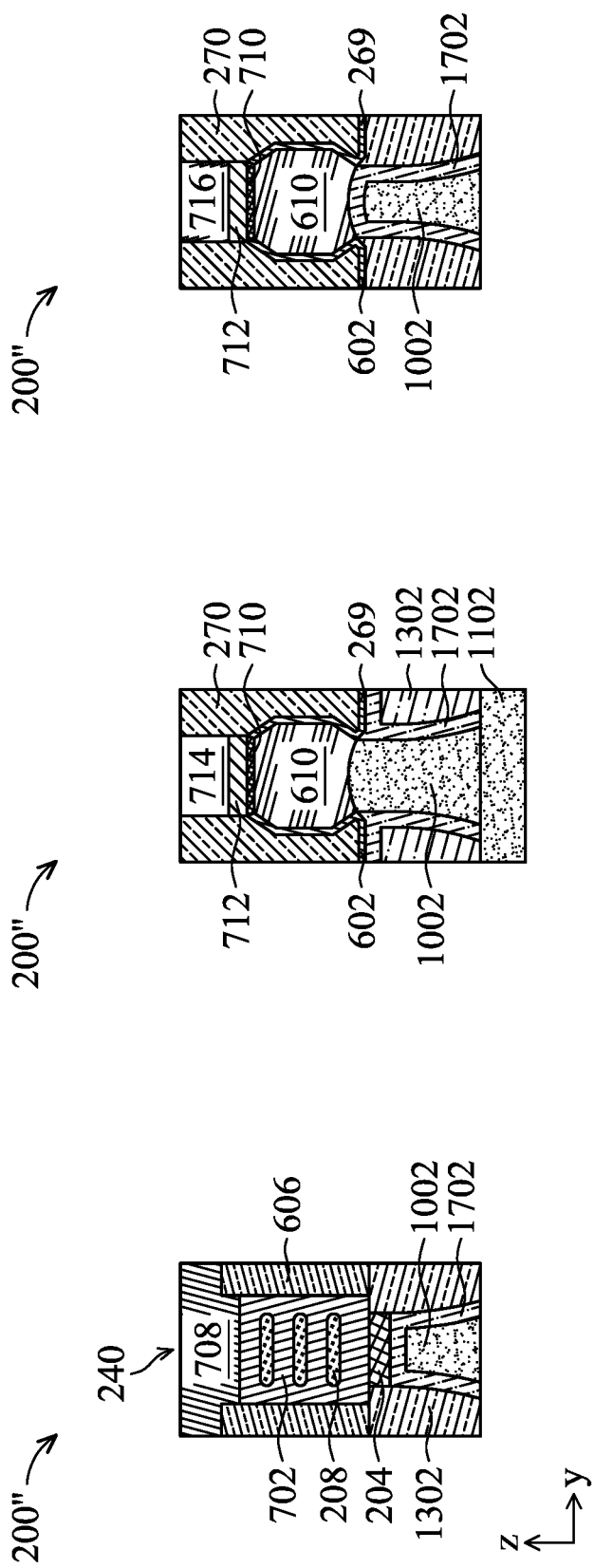

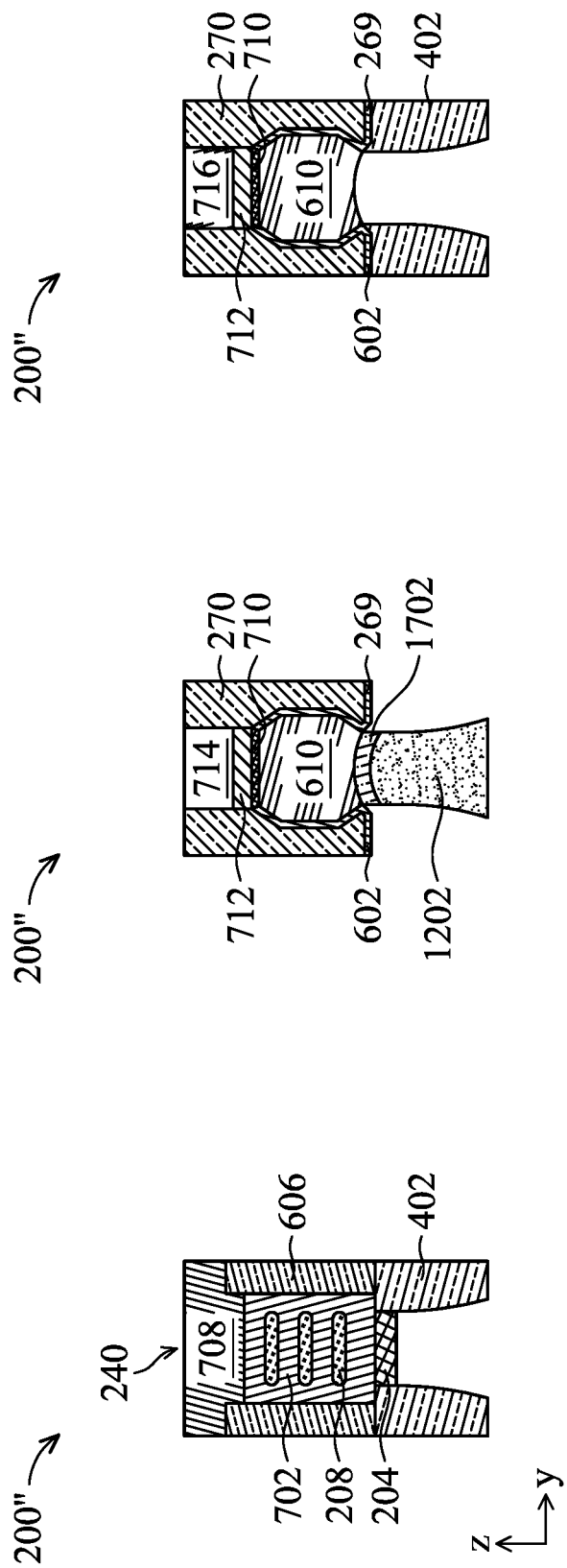

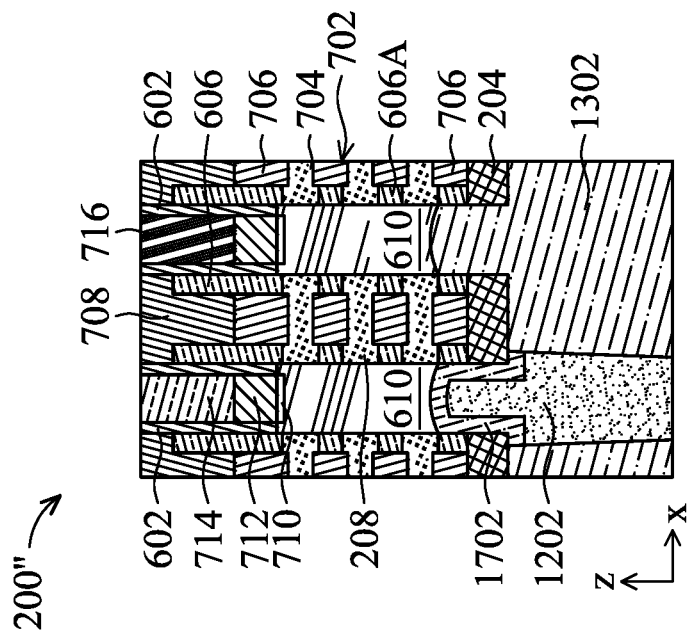
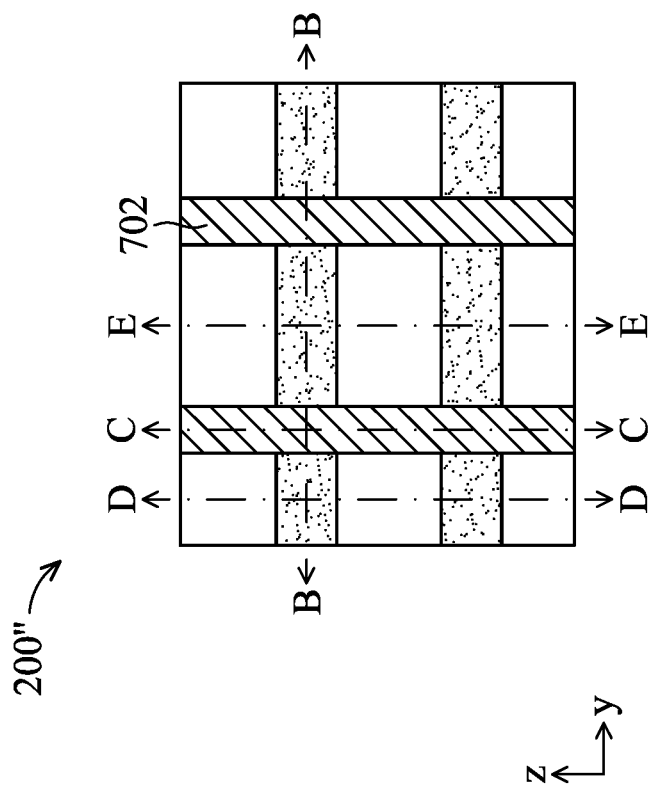
FIG. 20B
FIG. 20A

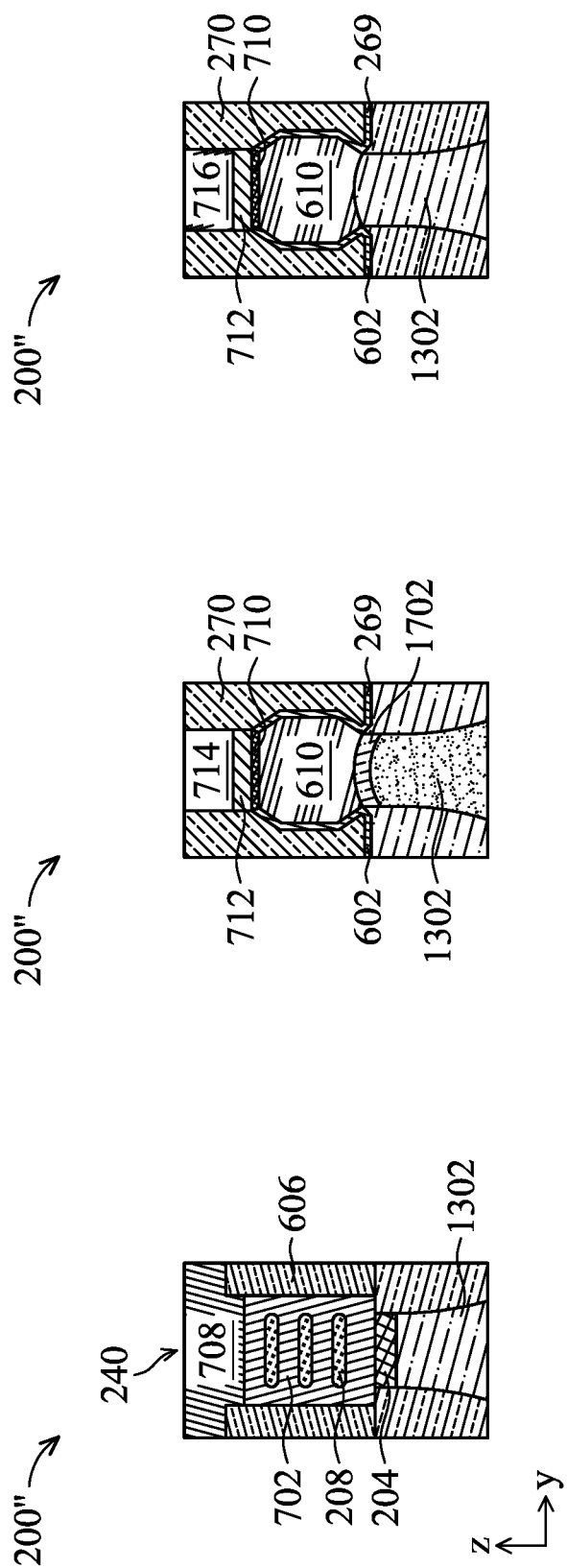

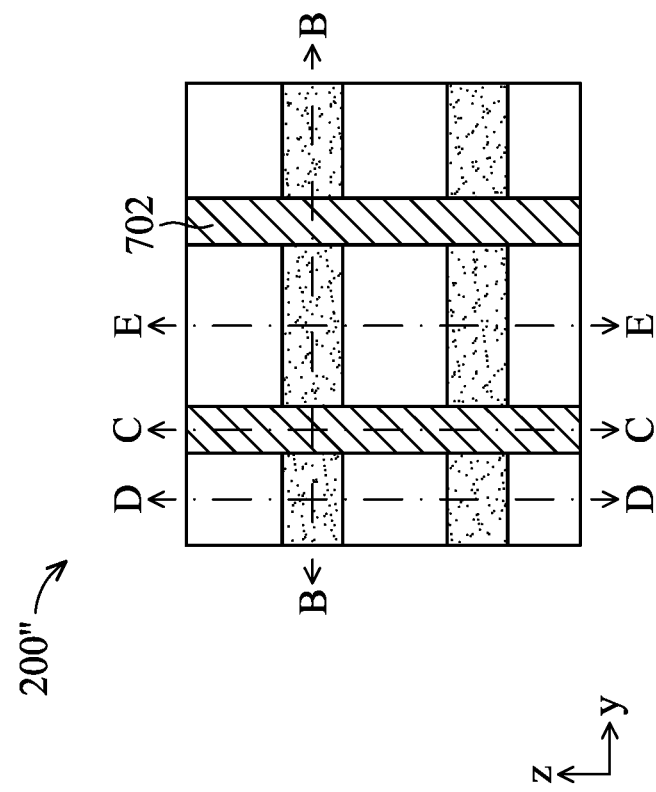
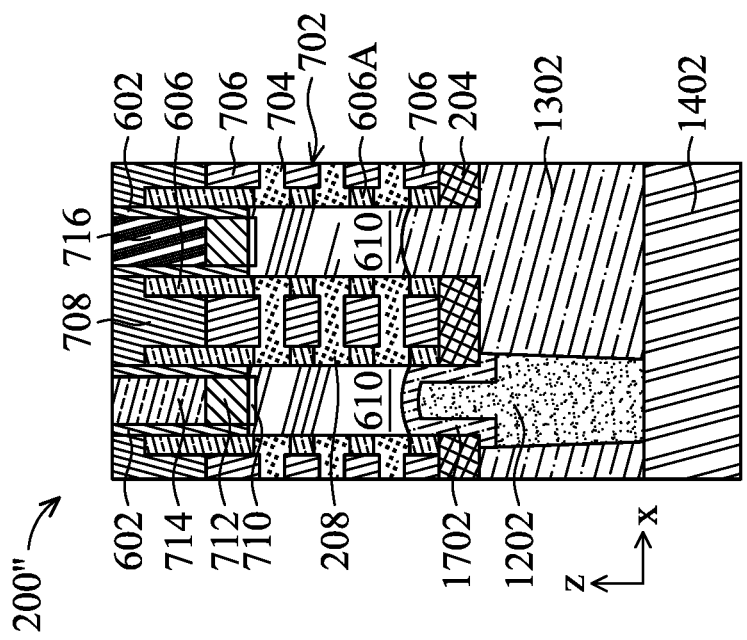
FIG. 21A
FIG. 21B

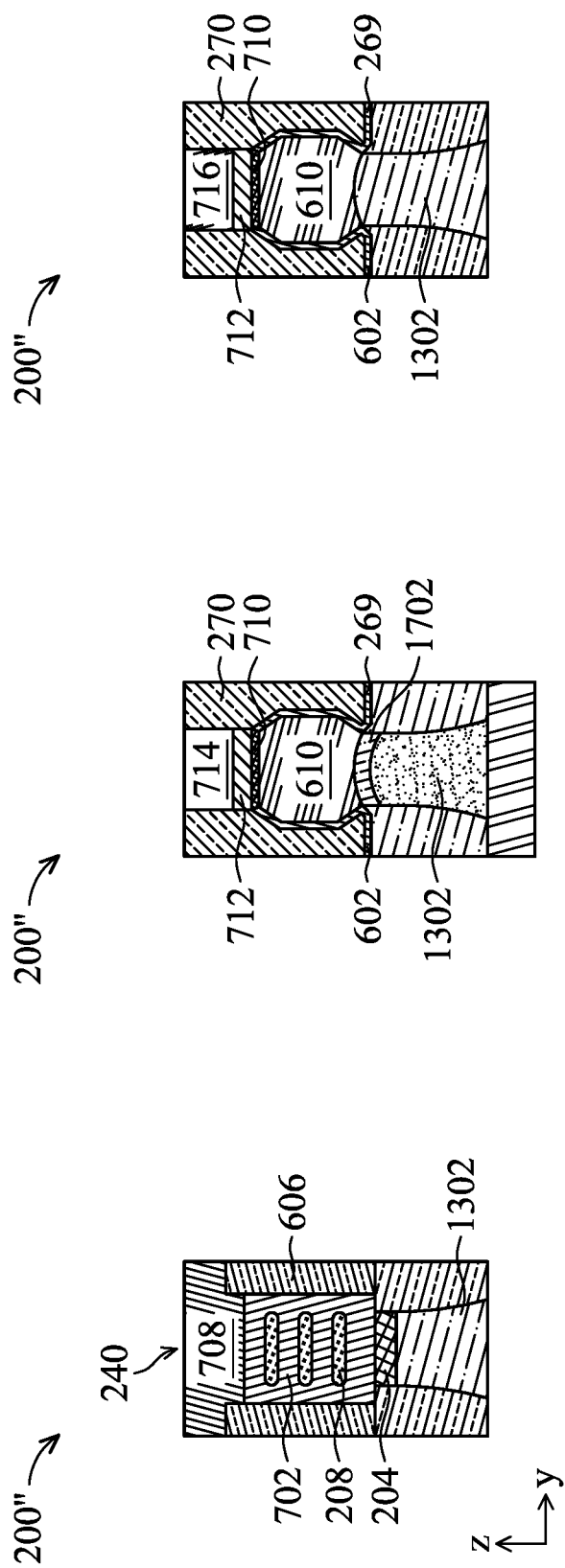

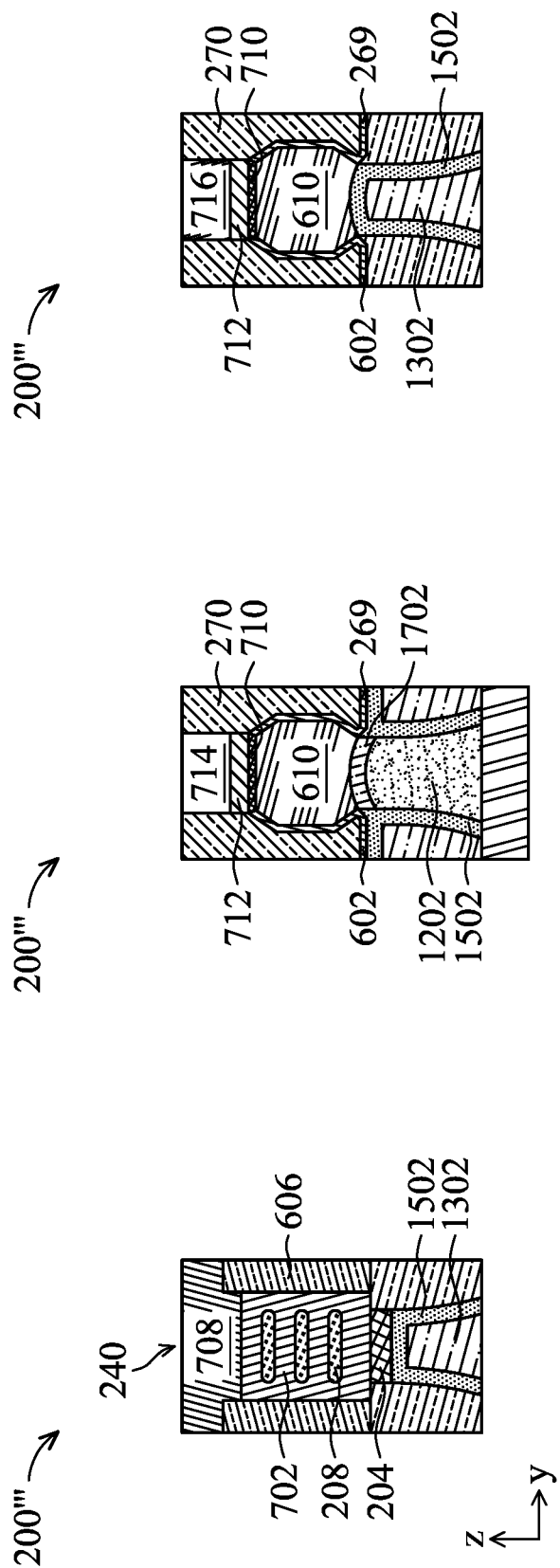

SEMICONDUCTOR DEVICE HAVING BACKSIDE VIA AND METHOD OF FABRICATING THEREOF

PRIORITY

This application claims the benefits to U.S. Provisional Application Ser. No. 63/016,686 filed Apr. 28, 2020, the entire disclosure of which is incorporated herein by reference.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Conventionally, integrated circuits (IC) are built in a stacked-up fashion, having transistors at the lowest level and interconnect (vias and wires) on top of the transistors to provide connectivity to the transistors. Typically, power rails (such as metal lines for voltage sources and ground planes) are also above the transistors and may be part of the interconnect. As the integrated circuits continue to scale down, so do the power rails. This inevitably leads to increased voltage drop across the power rails, as well as increased power consumption of the integrated circuits. Therefore, although existing approaches in semiconductor fabrication have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7A, 8A, 9A, 10A, 11A, 12A, 13A, 14A, 15A, 16A, 17A, 18A, 19A, 20A, 21A, and 22A illustrate top views of a portion of a semiconductor device, according to some embodiments.

FIGS. 7B, 8B, 9B, 10B, 11B, 12B, 13B, 14B, 15B, 16B, 17B, 18B, 19B, 20B, 21B, and 22B illustrate cross-sectional views of a portion of the semiconductor device along the B-B line in FIGS. 7A, 8A, 9A, 10A, 11A, 12A, 13A, 14A, 15A, 16A, 17A, 18A, 19A, 20A, 21A, and 22A respectively, according to some embodiments.

FIGS. 7C, 8C, 9C, 10C, 11C, 12C, 13C, 14C, 15C, 16C, 17C, 18C, 19C, 20C, 21C, and 22C illustrate cross-sectional views of a portion of the semiconductor device along the C-C line in FIGS. 7A, 8A, 9A, 10A, 11A, 12A, 13A, 14A, 15A, 16A, 17A, 18A, 19A, 20A, 21A, and 22A respectively, according to some embodiments.

FIGS. 7D, 8D, 9D, 10D, 11D, 12D, 13D, 14D, 15D, 16D, 17D, 18D, 19D, 20D, 21D, and 22D illustrate cross-sectional views of a portion of the semiconductor device along the D-D line in FIGS. 7A, 8A, 9A, 10A, 11A, 12A, 13A, 14A, 15A, 16A, 17A, 18A, 19A, 20A, 21A, and 22A, respectively, according to some embodiments.

FIGS. 7E, 8E, 9E, 10E, 11E, 12E, 13E, 14E, 15E, 16E, 17E, 18E, 19E, 20E, 21E, and 22E illustrate cross-sectional views of a portion of the semiconductor device along the E-E line in FIGS. 7A, 8A, 9A, 10A, 11A, 12A, 13A, 14A, 15A, 16A, 17A, 18A, 19A, 20A, 21A, and 22A, respectively, according to some embodiments.

DETAILED DESCRIPTION

Figure 1A:
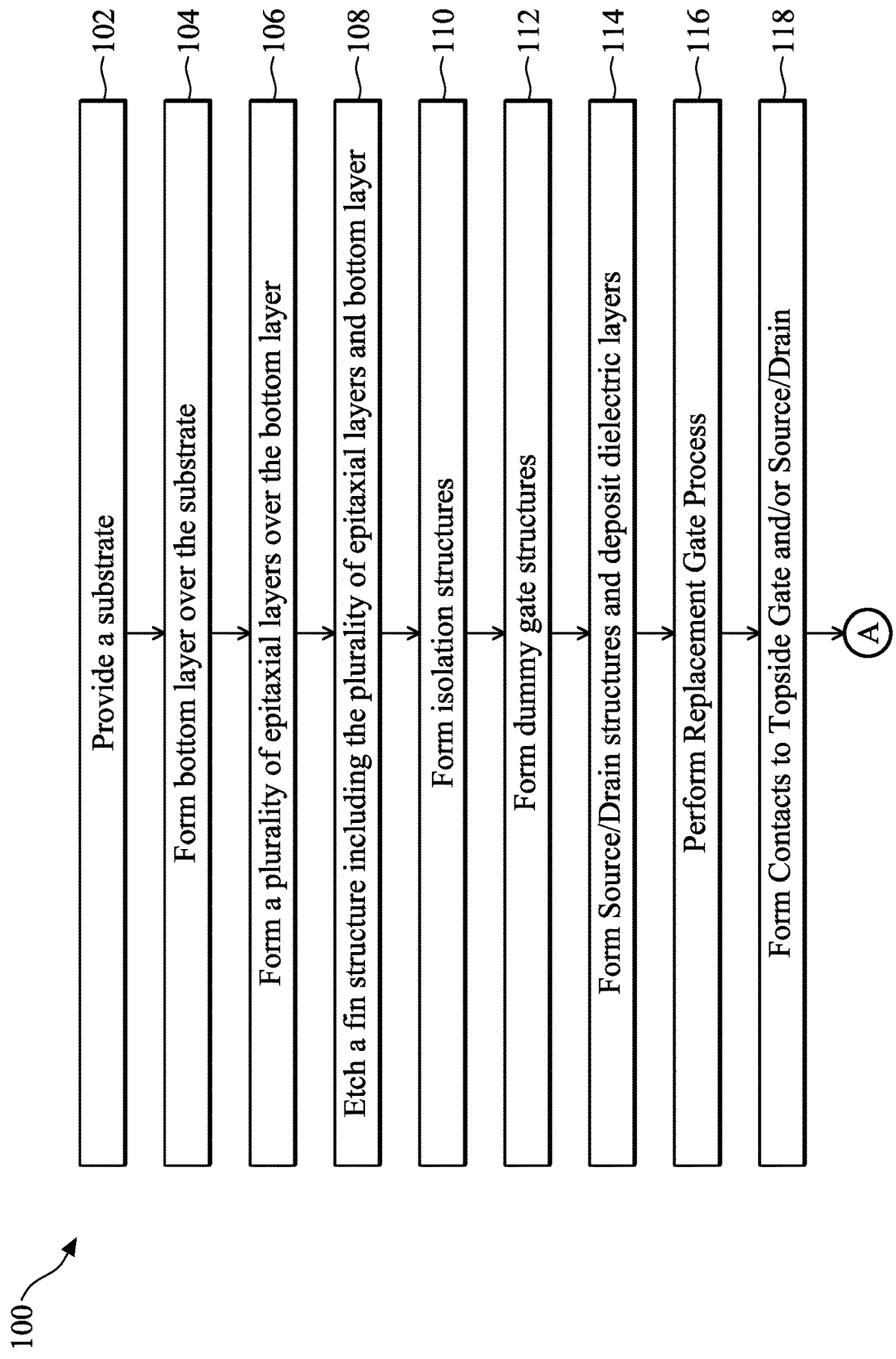
FIGS. 1A and 1B show a flow chart of a method of forming a semiconductor device with backside metallization and backside vias, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

It is also noted that the present disclosure presents embodiments in the form of multi-gate transistors and specifically exemplary gate-all-around (GAA) devices. Such a device may include a P-type metal-oxide-semiconductor GAA device or an N-type metal-oxide-semiconductor GAA device. A GAA device refers to a device having vertically-stacked horizontally-oriented multi-channel transistors, such as nanowire transistors and nanosheet transistors. GAA devices are promising candidates to take CMOS to the next stage of the roadmap due to their better gate control ability, lower leakage current, and fully FinFET device layout compatibility. The description of the GAA devices of the present disclosure are exemplary only and not limiting except to the extent specifically recited in the claims that follow. One of ordinary skill may recognize other examples of semiconductor devices that may benefit from aspects of the present disclosure. For example, some embodiments as described herein may also be applied to fin-type field effect transistors (FinFETs), Omega-gate (Ω-gate) devices, or Pi-gate (Π-gate) devices.

This application generally relates to semiconductor structures and fabrication processes, and more particularly to semiconductor devices with backside metallization (such as power rails) and backside vias. Aspects of the present disclosure provide power rails (or power routings) on a back side (or backside) of a structure containing transistors (such as gate-all-around (GAA) transistors and/or FinFET transistors) in addition to an interconnect structure (which may include power rails as well) on a front side (or frontside) of the structure. This configuration increases the number of metal tracks available in the structure for directly connecting to source/drain contacts and vias. It also allows for increased gate density leading to greater device integration.

An object of some embodiments of present disclosure provides a backside via structure for connecting the backside power rails to S/D features on the frontside. The devices and methods of the present disclosure include embodiments that allow for device performance improvement such as for the time dielectric distance breakdown including by depositing conductive material before configuring the via structure. Some embodiments and methods thus alleviate the chances of unwanted etching (e.g., contact structure loss) and/or alleviate issues with sufficient gap fill of conductive material in forming the backside via (e.g., avoiding formation of voids during gap fill process). Unwanted loss of adjacent materials (e.g., contact structure) in embodiments can result from the deep etching required to define the backside via hole, which can be mitigated by the methods and structures herein. The contact structure loss can also result from challenges in providing an etch stop structure when etching the backside via hole, e.g., etching dielectric to form the hole with respect to the surrounding dielectric materials, which is also mitigated by the etch selectivity provided by certain embodiments herein. One or more of these challenges is alleviated by some embodiments of the present disclosure.

Figure 1B:
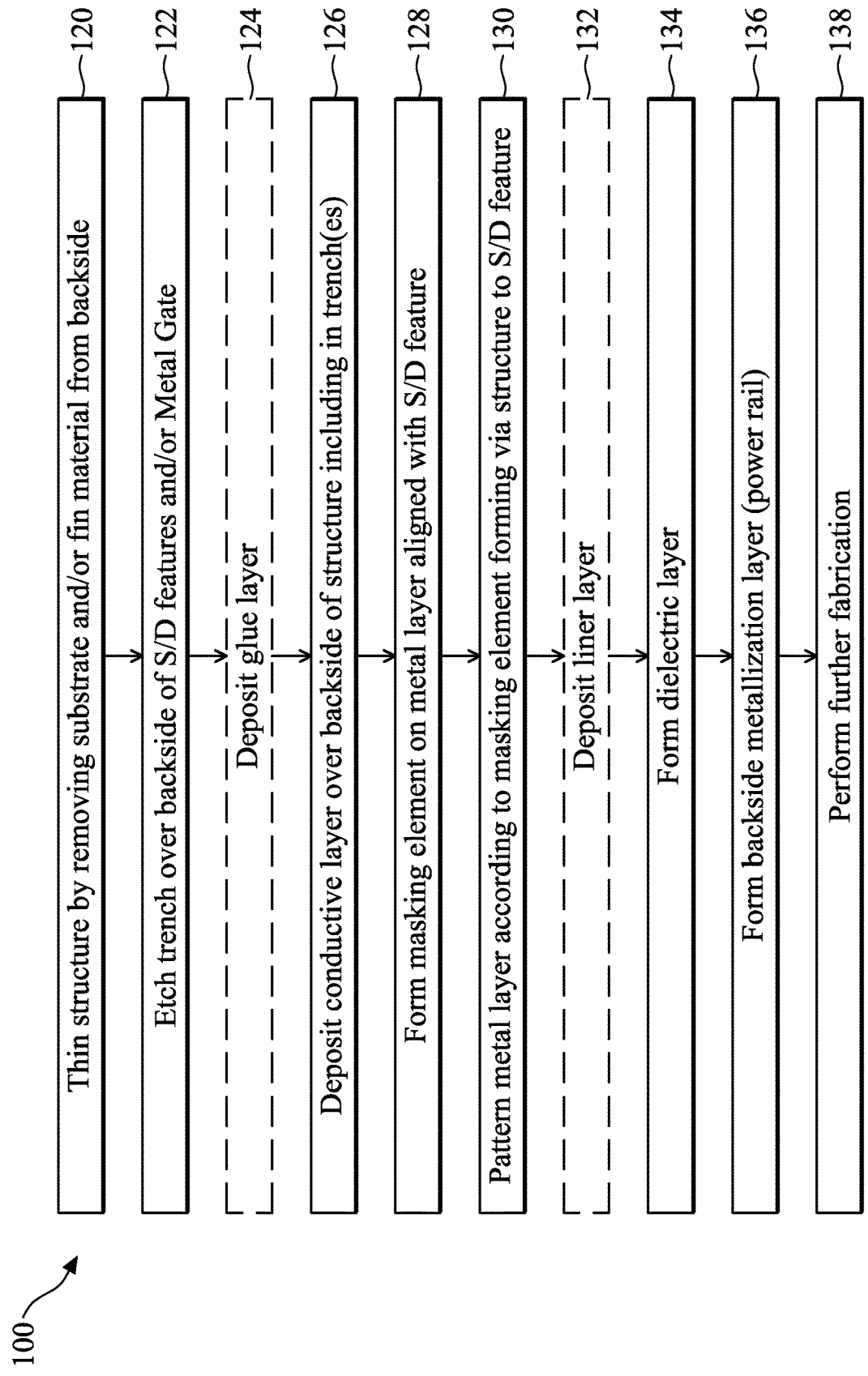

FIGS. 1A and 1B illustrate a flow chart of an embodiment of a method 100 for fabricating a semiconductor device according to various aspects of the present disclosure. It is understood that the method 100 includes steps having features of a complementary metal-oxide-semiconductor (CMOS) technology process flow and thus, are only described briefly herein. Additional steps may be performed before, after, and/or during the method 100.

Method 100 is described below in conjunction with FIG. 2 through FIG. 22E that illustrate various top and cross-sectional views of a semiconductor device (or a semiconductor structure) 200 at various steps of fabrication according to the method 100, in accordance with some embodiments. Further, the semiconductor device 200 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the inventive concepts of the present disclosure. In some embodiments, the semiconductor device 200 includes a plurality of semiconductor devices (e.g., transistors), including PFETs, NFETs, etc., which may be interconnected. Moreover, it is noted that the process steps of method 100, including any descriptions given with reference to the figures are merely exemplary and are not intended to be limiting beyond what is specifically recited in the claims that follow. Additional steps may be included in embodiments of the method 100; illustrated blocks may be omitted in embodiments of the method 100.

The method 100 begins at block 102 where a substrate is provided. Referring to the example of FIG. 2, a substrate 202 is provided. In some embodiments, the substrate 202 may be a semiconductor substrate such as a silicon substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include one or more epitaxial layers (epi-layers), may be strained for performance enhancement, may include a silicon-on-insulator (SOI) structure, and/or have other suitable enhancement features.

The method 100 then proceeds to block 104 where bottom self-aligned capping (bottom SAC) layer is formed on the substrate. Referring to the example of FIG. 2, a bottom layer 204 is provided. In an embodiment, the bottom layer 204 is a dielectric material. Exemplary dielectric materials of the bottom layer 204 include silicon oxide (SiO), SiOC, AlO, ZrSi, AlON, ZrO, HfO, TiO, ZrAlO, ZnO, TaO, LaO, YO, TaCN, SiN, SiOCN, SiOCN, ZrN, SiCN. It is noted that in some embodiments, the bottom layer 204 is not dielectric but other compositions such as Si or HfSi. The composition of the bottom layer 204 may be selected such that it provides sufficient etch selectivity when performing subsequent processing including as discussed in block 130. In an embodiment, the composition of the bottom SAC layer is selected such that it provides selectivity with respect to the conductive material of bottom via. In some embodiments, the bottom layer 204 may be between approximately 0.5 and 50 nanometers (nm) in thickness. The bottom layer 204 may be formed by processes such as chemical vapor deposition (CVD) including plasma-enhanced (PE-CVD), physical vapor deposition (PVD), plating, oxidation, and/or other suitable processes. It is noted that in some embodiments, the bottom layer 204 may be formed in whole or in part, after block 106, for example, by oxidation or other processes. In other embodiments, the stack of block 106 is formed upon the completed bottom layer 204.

The method 100 then proceeds to block 106 where a stack of a plurality of epitaxial layers are grown on the substrate. Referring to the example of FIG. 2, a stack 206 of a plurality of alternating layers of a first composition 208 and a second composition 210 are provided. In an embodiment, the epitaxial layers of the first composition (e.g., used to form layers 210) are SiGe and the epitaxial layers of the second composition (e.g., used to form layers 208) are silicon (Si). However, other embodiments are possible including those that provide for a first composition and a second composition having different oxidation rates and/or etch selectivity. For example, in some embodiments, either of the epitaxial layers of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. By way of example, epitaxial growth of the epitaxial layers of the first composition or the second composition may be performed by a molecular beam epitaxy (MBE) process, a metalorganic chemical vapor deposition (MOCVD) process, and/or other suitable epitaxial growth processes. It is also noted that while the layers 208, 210 are shown as having a particular stacking sequence, other configurations are possible.

It is noted that the stack 206 is illustrated as including five (5) layers of the epitaxial layer 210 and five (5) layers of the epitaxial layer 208, this is for illustrative purposes only and not intended to be limiting beyond what is specifically recited in the claims. It can be appreciated that any number of epitaxial layers can be formed, where for example, the number of epitaxial layers depends on the desired number of semiconductor channel layers for the GAA transistor. In some examples, the number of epitaxial layers, and thus the number of semiconductor channel layers, is selected based on the device type being implemented by the GAA transistor (e.g., such as core (logic) devices, SRAM devices, or analog devices, among others). In some embodiments, the number of epitaxial layers 208, and thus the number of semiconductor channel layers, is between 4 and 10. In some embodiments, the epitaxial layers 310 each have a thickness range of about 4-8 nanometers (nm). In some cases, the epitaxial layers 308 each have a thickness range of about 4-8 nm. The epitaxial layers 308 may serve as channel region(s) for a subsequently-formed multi-gate device (e.g., a GAA transistor) and its thickness may be chosen based at least in part on device performance considerations. The epitaxial layers 310 may serve to define a gap distance between adjacent channel region(s) for the subsequently-formed multi-gate device and its thickness may also be chosen based at least in part on device performance considerations.

After forming a stack of the epitaxial layers of the first composition (e.g., used to form the layers 210) and the epitaxial layers of the second composition (e.g., used to form the layers 208), a hard mask (HM) layer may be formed. In some embodiments, the HM layer may be subsequently patterned, as described below, to form an HM layer 304, where the HM layer 304 includes an oxide layer (e.g., a pad oxide layer that may include $SiO_2$) and nitride layer (e.g., a pad nitride layer that may include $Si_3N_4$) formed over the oxide layer. In some examples, the oxide layer may include thermally grown oxide, CVD-deposited oxide, and/or ALD-deposited oxide, and the nitride layer may include a nitride layer deposited by CVD or other suitable technique. Generally, in some embodiments, the HM layer may include a nitride-containing material deposited by CVD, ALD, PVD, or other suitable process.

The method 100 then proceeds to block 108 where a fin structure is formed by etching the plurality of epitaxial layers, the bottom layer, and/or a portion of the substrate. Referring to the example of FIG. 3, a fin structure or simply fin 302 is formed. In some embodiments, after forming a patterned hard mask layer 304, the fins 302 extending from the substrate 202 are formed using the hard mask layer 304 as an etching mask. The fins 302 may be fabricated using suitable processes including photolithography and etch processes. The photolithography process may include forming a photoresist layer over the device 200, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process forms trenches 306 in unprotected regions through the HM layer 304, through the epitaxial layers of the first composition and the second composition, and into the substrate 202, thereby leaving the plurality of extending fins 302. The trenches 306 may be etched using a dry etch (e.g., reactive ion etching), a wet etch, and/or other suitable processes.

In various embodiments, each of the fins 302 includes a lower fin portion 202A formed from the substrate 202, the bottom layer 204, the layers 210 (e.g., including the first composition), the layers 208 (e.g., including the second composition), and the HM layer 304. The HM layer 304 may be removed (e.g., by a CMP process) prior to or after formation of the fins 302.

Figure 4:
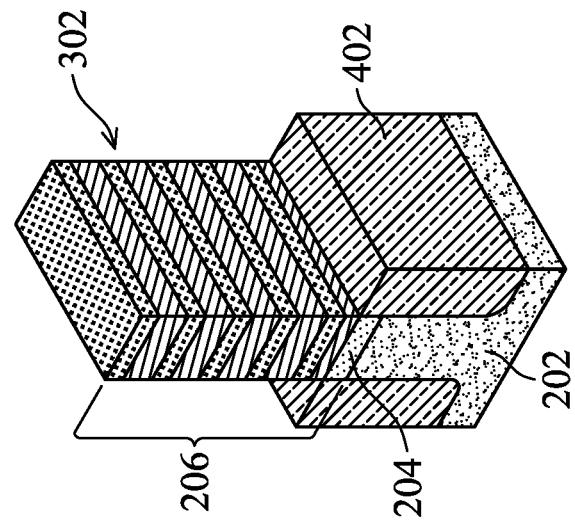
FIGS. 2, 3, 4, 5, and 6 illustrate perspective views of a portion of a semiconductor device fabricated according to aspects of FIGS. 1A and 1B, according to some embodiments.
Figure 3:
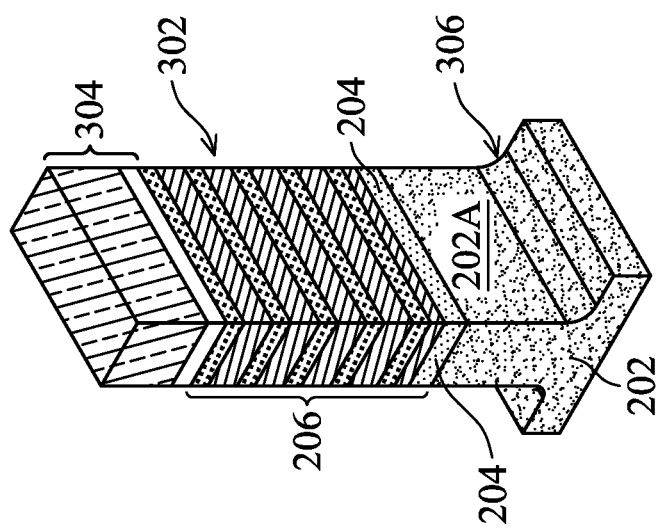
Figure 2:
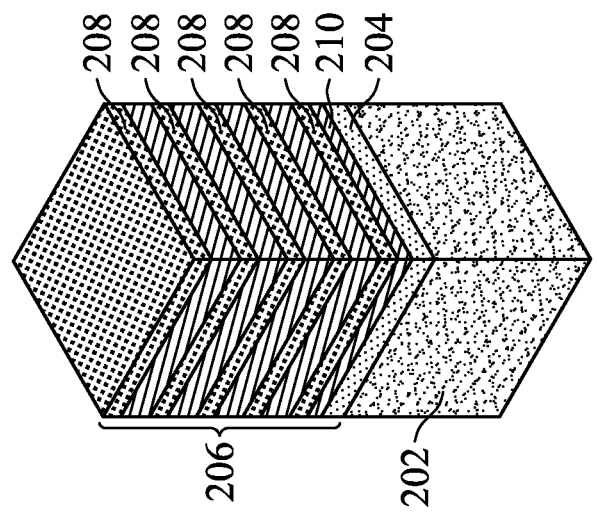

The method 100 then proceeds to block 110 where shallow trench isolation (STI) features are formed. With reference to FIG. 4, in an embodiment of block 110, STI features 402 are formed adjacent and interposing the fins 302. In some examples, after forming the fins 302, the trenches 306 (FIG. 3) interposing the fins 302 may be filled with a dielectric material. In some embodiments, the dielectric material used to fill the trenches 306 may include $SiO_2$, silicon nitride, silicon oxynitride, fluorine-doped silicate glass (FSG), a low-k dielectric, combinations thereof, and/or other suitable materials known in the art. In various examples, the dielectric material may be deposited by a CVD process, a subatmospheric CVD (SACVD) process, a flowable CVD process, an ALD process, a PVD process, and/or other suitable process.

In some embodiments, after depositing the dielectric material, a CMP process may be performed to remove excess portions of the dielectric material and to planarize a top surface of the device 200, thereafter the dielectric material is etched back, thus forming the STI features 402, as shown in FIG. 4. In some embodiments, the CMP process may also remove the HM layer 304 over each of the fins 302. In some embodiments, the recessing of the insulating material to form the STI features 402 includes recessing the STI features 402 to having a top surface coplanar with the bottom layer 204.

The method 100 then proceeds to block 112 where dummy gate structures are formed over the fin structures. Referring to the example of FIG. 5, a gate structure or stack 502 is formed over the fin structures 302. In an embodiment, the gate structures 502 are dummy (sacrificial) gate stacks that are subsequently removed and replaced by the final gate stack at a subsequent processing stage of the device 200, as discussed below. Specifically, in some embodiments, the gate structure 502 may be replaced at a later processing stage by a high-K dielectric layer (HK) and metal gate electrode (MG). In some embodiments, the gate structures 502 include a dielectric layer 504 and an electrode layer 506. The gate structures 502 may also include one or more hard mask layers 508. As discussed above, the hard mask layer 508 may include a multi-layer structure such as an oxide layer and a nitride layer. In some embodiments, the gate structures 502 are formed by various process steps such as layer deposition, patterning, etching, as well as other suitable processing steps. Exemplary deposition processes include CVD (including both low-pressure CVD and plasma-enhanced CVD), PVD, ALD, thermal oxidation, e-beam evaporation, or other suitable deposition techniques, or a combination thereof. In forming the gate structures 502 for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

Figure 6:
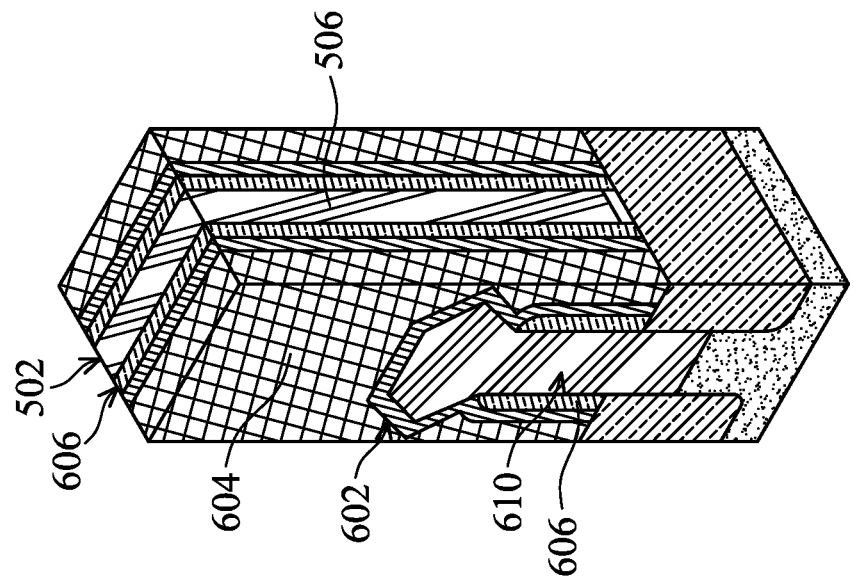
Figure 5:
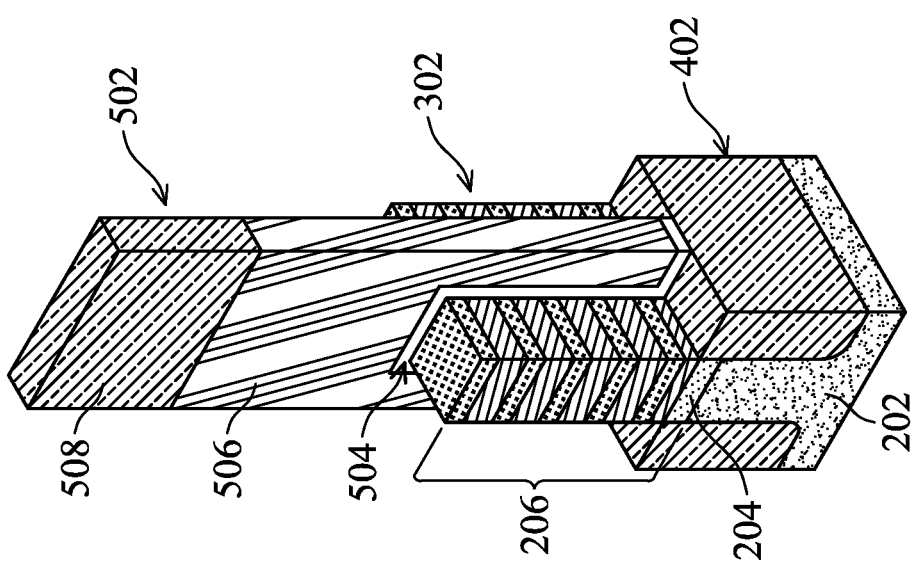
Figures 8A, 8B:
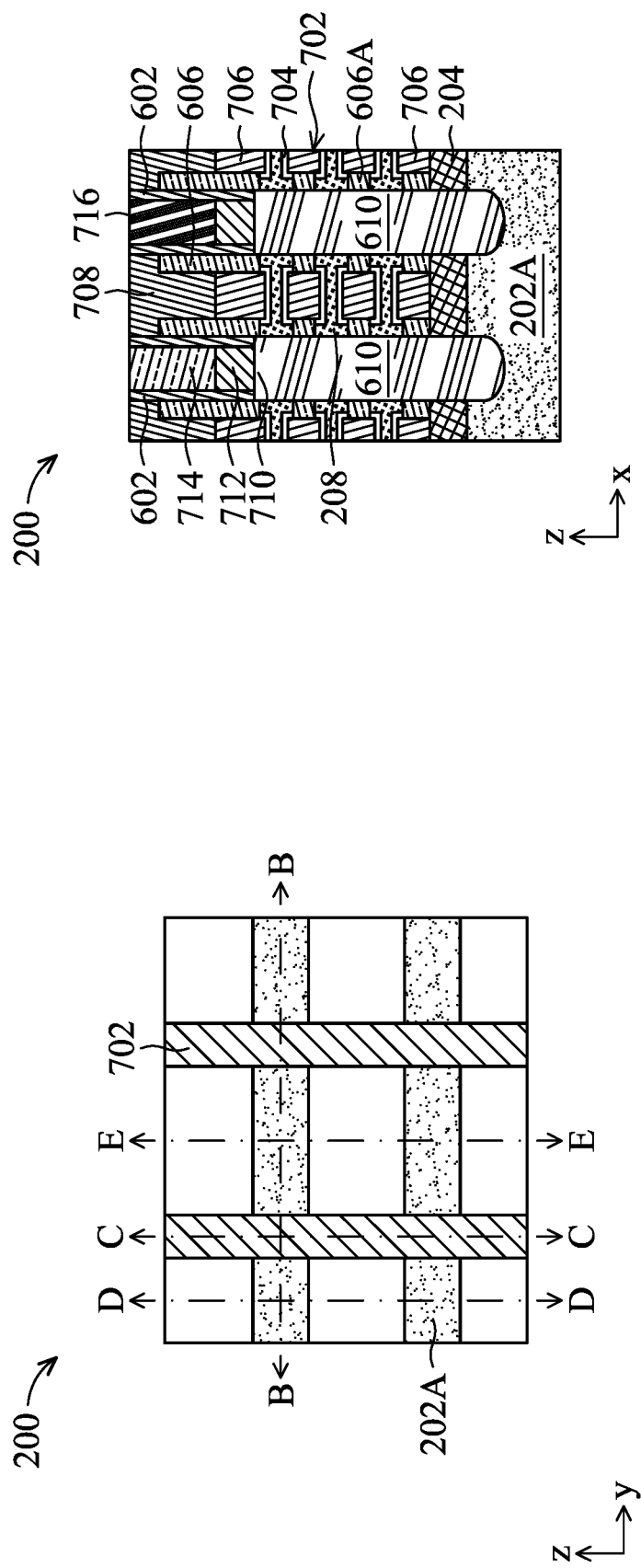
Figure 10B:
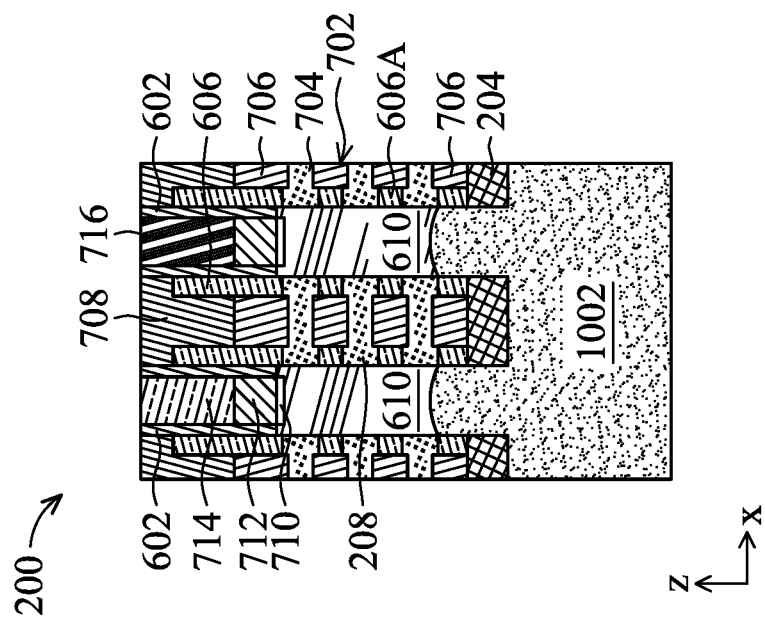
Figure 10A:
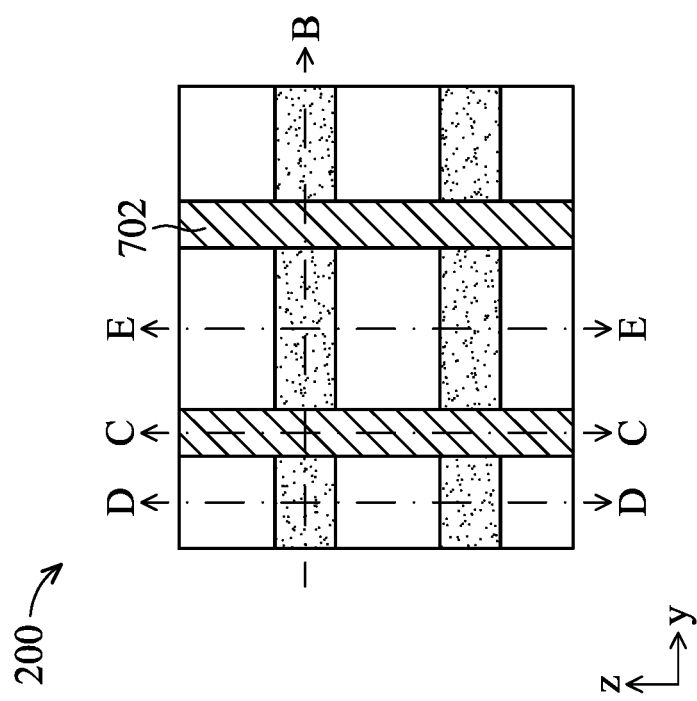
Figures 10C, 10D, 10E:
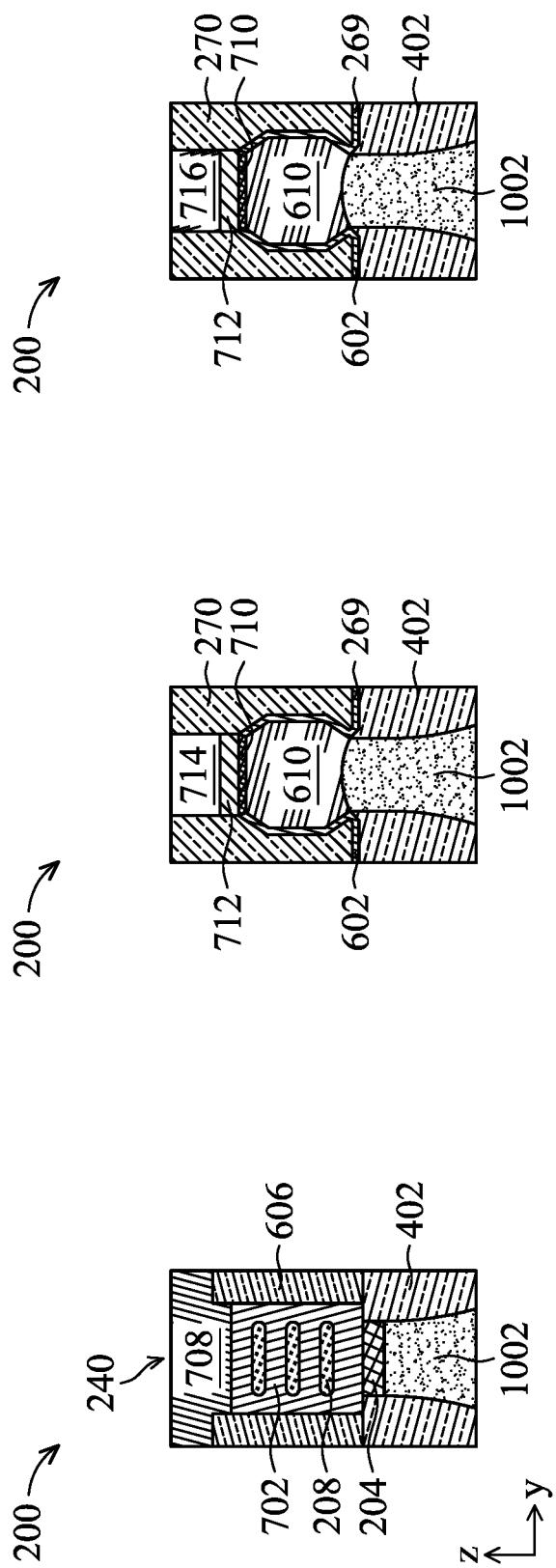
Figures 12A, 12B:
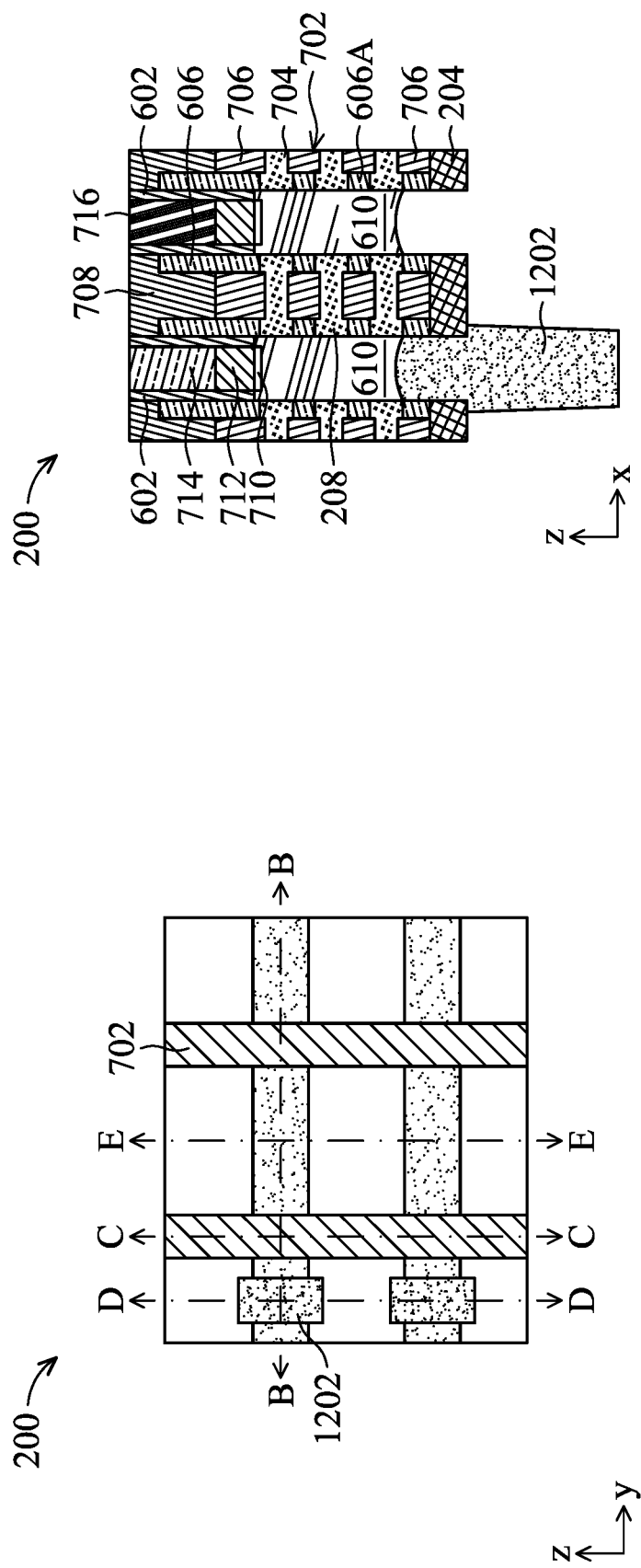
Figure 13B:
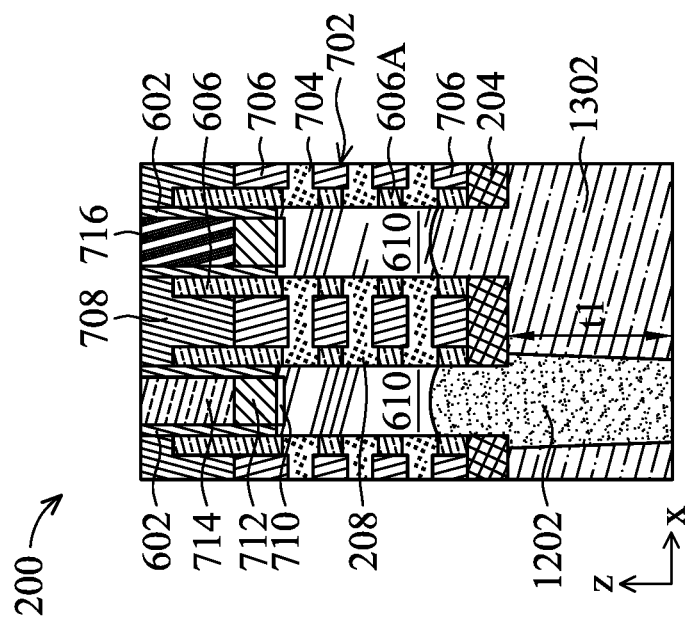
Figure 13A:
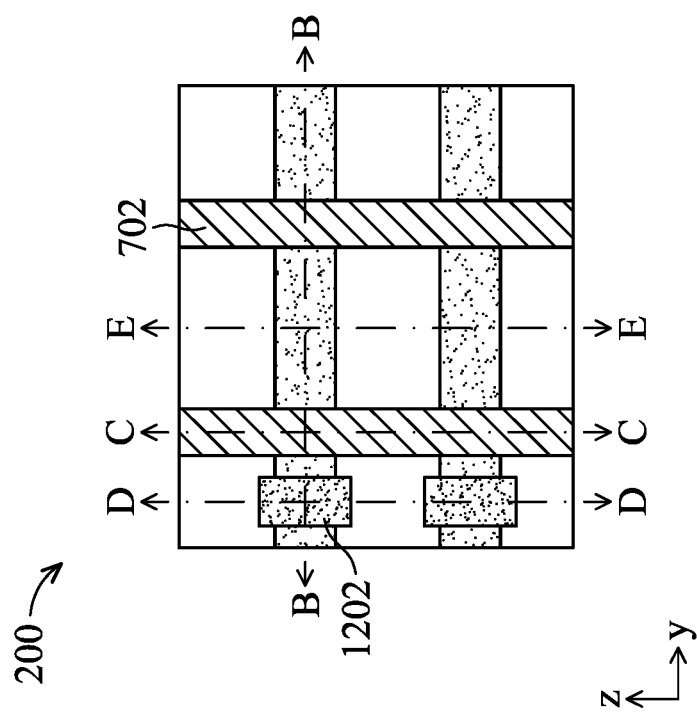

The method 100 then proceeds to block 114 where source/drain features and adjacent dielectric layers such as contact etch stop layer (CESL) and/or interlayer dielectric (ILD) layers are formed. Referring to the example of FIG. 6, illustrated are source/drain features 610 formed adjacent the gate structure 502, a CESL 602, and ILD 604 are illustrated. Spacer elements 606 are illustrated adjacent the gate structure 502 and the source/drain features 610.

In some embodiments, a contact etch stop layer (CESL) 602 is formed over the devices prior to forming the ILD layer 604. In some examples, the CESL 602 includes a silicon nitride layer, silicon oxide layer, a silicon oxynitride layer, and/or other materials known in the art. The CESL 602 may be formed by plasma-enhanced chemical vapor deposition (PECVD) process and/or other suitable deposition or oxidation processes. In some embodiments, the ILD layer 604 includes materials such as tetraethylorthosilicate (TEOS) oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials. The ILD layer 604 may be deposited by a PECVD process or other suitable deposition technique.

In a further embodiment of block 114, and after depositing the ILD layer 604 (and/or the CESL 602 or other dielectric layers), a planarization process may be performed to expose a top surface of the gate structure 502. For example, the planarization process may include a CMP process which removes portions of the ILD layer 604 (and CESL 602, if present) overlying the gate structure 502 and planarizes a top surface of the devices 200. In addition, the CMP process may remove the hard mask layers 508 overlying the gate structure 502 to expose the underlying electrode layer 506, such as a polysilicon electrode layer, of the gate structure 502.

It is noted that in FIG. 6, the device 200 also includes spacer elements 606 on the sidewalls of the gate structure 502 and the source/drain region 610. In some embodiments, one or more of these spacers may be omitted. In some embodiments, the spacer elements 606 include a plurality of layers. In some examples, the spacer elements 606 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. By way of example, the spacer element 606 may be formed by conformally depositing a dielectric material over the device 200 (e.g., including fin 302) using processes such as a CVD process, a subatmospheric CVD (SACVD) process, a flowable CVD process, an ALD process, a PVD process, or other suitable process.

In some embodiments of the block 114, source/drain (S/D) features, illustrated as S/D features 610 of FIG. 6, are formed by epitaxially growing a semiconductor material layer in the source/drain regions for example prior to deposition of the CESL and ILD layers discussed above. In various embodiments, the semiconductor material layer grown to form the source/drain features 610 may include Ge, Si, GaAs, AlGaAs, SiGe, GaAsP, SiP, SiC, or other suitable material. The source/drain features 610 may be formed by one or more epitaxial (epi) processes. In some embodiments, the source/drain features 610 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 610 are not in-situ doped, and instead an implantation process is performed to dope the source/drain features 610. In some embodiments, formation of the source/drain features 610 may be performed in separate processing sequences for each of N-type and P-type source/drain features.

In some embodiments, including as illustrated in FIG. 6, the source/drain features 610 are formed after a portion of the fin 302 is recessed in the source/drain regions. The source/drain features 610 are formed on a seed area provided at a top surface of the recessed fin 302, e.g., fin portion 202A. In some embodiments, the recessing of the fin 302 is sufficient to remove (e.g., etch away) the bottom layer 204 in the source/drain region. In other words, the source/drain feature 620 interfaces the fin portion 202A of the substrate.

The method 100 then proceeds to block 116 where a replacement gate process is performed and/or the channel regions of the device are "released" in the channel area of the fin. Specifically, block 116 may include removal of dummy gates structures, and a channel layer release process is performed. In some embodiments, the exposed electrode layer 506 of the gate structure 502 may initially be removed by suitable etching processes, followed by an etching process to remove the dielectric layer 504. Exemplary etching processes include a wet etch, a dry etch, or a combination thereof.

After removal of the dummy gate structures, and in a further embodiment of block 116, the layers 210 (e.g., SiGe layers) in the channel region of the devices 200 may be selectively removed (e.g., using a selective etching process), while the layers 208 (e.g., Si semiconductor channel layers) remain to form the channel of the device 200. The selective etching process may be performed through a trench provided by the removal of the dummy gate electrode discussed above. In some embodiments, by removal of layers 210 in the channel region, gaps may be formed between the adjacent nanowires in the channel region (e.g., between adjacent epitaxial layers 208) within which the gate structure is formed. In some embodiments, inner spacers are formed adjacent the gate structures.

Referring now to FIGS. 7A-7E, the semiconductor device 200 illustrated in FIGS. 2-6 is now illustrated in associated cross-sectional views according to the lines drawn in the top view. Cross-sectional line B of FIG. 7A is illustrated in FIG. 7B; cross-sectional line C of FIG. 7A is illustrated in FIG. 7C; cross-sectional line D of FIG. 7A is illustrated in FIG. 7D. This pattern continues for the remaining Figures.

Referring to the example of FIGS. 7A-7E, after removal of gate 502 and release (e.g., etching of layers 210) of the channel regions, a gate structure 702 is formed over and between channel regions 208, for example, in the gaps created by the removal of layers 210 in the channel region as discussed above. In an embodiment, inner spacers 606A may be formed in these gaps such that the inner spacer 606A is disposed between the gate structure 702 and the S/D features 610. The inner spacers 606A may comprise SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, or combinations thereof. In some embodiments, the inner spacers 606A may be the same material as the spacers 606. In some embodiments, the inner spacers 606A are different materials than the spacers 606 and formed through different processes. In an embodiment, the spacers 606 and/or inner spacers 606A may have a thickness of between approximately 1 nm and approximately 40 nm.

The gate structure 702 may include a high-K/metal gate stack, however other compositions are possible. In some embodiments, the gate structure 702 includes a high-k dielectric layer 704 and a metal electrode 706. In some embodiments, the gate structure 702 further includes an interfacial layer (IL). High-K gate dielectrics, as used and described herein, include dielectric materials having a high dielectric constant, for example, greater than that of thermal silicon oxide (~3.9). In some embodiments, the high-K dielectric layer 704 may include a high-K dielectric layer such as hafnium oxide ($HfO_2$). Alternatively, the high-K gate dielectric layer 704 may include other high-K dielectrics, such as $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. In various embodiments, the high-K dielectric layer 704 may be formed by ALD, physical vapor deposition (PVD), pulsed laser deposition (PLD), CVD, and/or other suitable methods. The metal layer(s) 706 may include a metal, metal alloy, or metal silicide. In some embodiments, the metal layer 706 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 706 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer 706 may be formed by ALD, PVD, CVD, e-beam evaporation, or other suitable process. Further, the metal layer 706 may provide an N-type or P-type work function, may serve as a transistor (e.g., GAA transistor) gate electrode.

As discussed above, the device 200 includes the substrate 202 at its backside and various elements built on the front surface of the substrate 202. These elements discussed above include the isolation structure 402 over the substrate 202, the semiconductor fin portion 202A extending from the substrate 202 and adjacent to the isolation structure 402, the epitaxial source/drain (S/D) features 610 over a recessed portion the fin portion 202A, one or more channel semiconductor layers 208 suspended over the fin portion 202A and connecting the two S/D features 610, the gate structure 702 is disposed between the two S/D features 610 and wrapping around each of the channel layers 208, the bottom layer 204 disposed between the semiconductor fin portion 202A and the gate stack 702, the inner spacers 606A between the S/D features 610 and the gate stack 702, the CESL 602, and the ILD 604 each of which is illustrated in FIGS. 7A-7E.

FIGS. 7A-7E further illustrate features of the device 200 that provide contact or connection to one or more of the terminals of the device 200. Over the gate structure 702, the semiconductor device 200 further includes a self-aligned capping (SAC-1) layer 708. Exemplary materials for the SAC-1 layer 708 include be SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, and combinations thereof. The SAC-1 layer 708 includes a width w1. The width w1 may be between approximately 3 and 30 nanometers (nm).

Over each of the S/D features 610, the semiconductor device 200 further includes silicide features 710 and S/D contacts 712. In some embodiments, silicide features 710 are omitted. Exemplary materials for the S/D contacts 712 include TaN, Mo, Ni, W, Ru, Co, Cu, Ti, TiN, Ta, and combinations thereof.

A dielectric S/D capping layer 714 overlies a first S/D feature 610 and a S/D contact via 716 overlies a second S/D contact 610. In an embodiment, the S/D capping layer 714 is disposed over the source feature 610 (left), and the S/D contact via 716 is disposed over the drain feature 610 (right). In alternative embodiments, the S/D capping layer 714 may be disposed over the drain feature 610 (right), and the S/D contact via 716 may be disposed over the source feature 610 (left). In some embodiments, the S/D capping layer 714 may be disposed over both the source and the drain features 610.

Exemplary materials for the S/D capping layer 714 include materials such as SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, and combinations thereof. In an embodiment, the S/D capping layer 714 is a dielectric material. The S/D capping layer 714 has a width w2. In some embodiments, the width w2 is between approximately 3 and 30 nm. In some embodiments, the S/D capping layer 714 is a different composition than the SAC-1 layer 708. In an embodiment, the S/D capping layer 714 is referred to as a self-aligned capping layer (SAC-2). The S/D contact via 716 provides electrically connection to the S/D feature 610. Exemplary materials for the S/D contact via 716 include TaN, Mo, Ni, W, Ru, Co, Cu, Ti, TiN, Ta, and combinations thereof. Thus, in some embodiments, one S/D feature 610 of the device is electrically connected, via the S/D contact via 716, from its topside and the other S/D feature 610 of the device is not electrically connected from its topside, the S/D capping layer 714 not providing an electrical connection.

In some embodiments, the SAC layer 708 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The SAC layer 708 protects the gate stacks 702 from processing (e.g., etching and CMP processes) including those that are used for etching S/D contact holes. The SAC layer 708 may be formed by recessing the gate stacks 702 depositing one or more dielectric materials over the recessed gate stacks 702, and performing a CMP process to the one or more dielectric materials. The SAC layer 708 may have a thickness in a range of about 3 nm to about 30 nm, for example.

In some embodiments, the silicide features 710 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the S/D contacts 712 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contacts 712.

As discussed above, the capping layer 714 protects certain ones of the S/D contacts 712 from processing steps (e.g., etching and CMP processes) and isolates the given S/D contacts 712 from the interconnect structure formed thereon. The capping layer 714 may have a thickness in a range of about 3 nm to about 30 nm. In some embodiments, the SAC layer 708 and the capping layer 714 include different materials to achieve etch selectivity, for example, during the formation of the capping layer 714. As the capping layer 714 does not provide electrical connection to the given S/D contact 712, the contact to the feature 610 underlying the capping layer 714 (left in FIG. 7B, and FIG. 7D) is made by way of a backside connection discussed below.

In an embodiment of block 118 of the method, contacts are formed to the topside of the gate and/or one or more source/drain features. Referring to the example of FIGS. 7A-7E, in an embodiment, the S/D contact via 716 is formed on the topside of the device interfacing the source/drain feature 610 that underlies the via 716. The S/D contact via 716 may include a conductive barrier layer and a metal fill layer over the conductive barrier layer. Exemplary conductive barrier layer materials include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. Exemplary metal fill layer materials for the S/D contact via 716 include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contact via 716. As illustrated in FIG. 7E and FIG. 7B, this S/D feature 610 underlying the via 716 is electrically connected to through the via 716 to an overlying multi-layer interconnect (MLI).

With respect to the MLI, it is noted that the semiconductor device 200 may further include one or more interconnect layers that include with metal lines and vias embedded in dielectric layers, referred to herein as a multi-layer interconnect (MLI). The MLI is typically formed above the frontside/topside of the device 200 of FIG. 7B. The MLI connects gate, source, and drain electrodes of various transistors, as well as other circuits in the device 200, to form an integrated circuit in part or in whole. The semiconductor device 200 may further include passivation layers, adhesion layers, and/or other layers built on the frontside of the semiconductor device 200.

The method 100 then proceeds to block 120 where the structure is thinned by the removal of the substrate material from the backside of the structure. In some embodiments, the thinning is provided by attaching the frontside of the device 200 to a carrier, while the backside of the structure is thinned. Referring to the example of FIGS. 8A-8E, the structure is thinned by removing substrate 202 from the backside of the structure until the semiconductor fin portion 202A and adjacent isolation structure 402 are exposed from the backside of the device 200. The thinning process may include a multi-step processing including, for example, a mechanical grinding process followed by a chemical thinning process.

The method 100 then proceeds to block 122 where trenches are etched in the backside of the structure and over the S/D features and gate structure. Referring to the example of FIGS. 9A-9E, the portions of the substrate including the fin portion 202A forming the fin 302 and/or portions of the S/D features 610 are etched to form trenches 902. The trenches 902 are formed over backside of the structure and are aligned with each of the gate stack 702 and each of the S/D features 610. It is noted that the bottom layer 204 may serve to protect the gate structure 702 during the etching processes. In some embodiments, the substrate 202 including portion 202A is silicon and the bottom layer 204 is a dielectric material providing suitable etch selectivity to the substrate composition. The trenches 902 expose surfaces of the S/D features 610 from the backside. In some embodiments, block 122 may include more than one etching processes. For example, it may apply a first etching process to selectively remove the fin portion 202A, and then apply a second etching process to selectively recess the S/D features 610 to the desired level, where the first and the second etching processes use different etching parameters such as using different etchants. The etching process(es) can be dry etching, wet etching, reactive ion etching, or other etching methods.

In the illustrated embodiment, the trenches 902 extend to a portion of the S/D feature coplanar with or below (i.e., towards the backside) the lowest channel region 208. In an embodiment, the trenches 902 may be etched using the bottom of the source/drain feature 610 as an etch stop. Thus, in some embodiments, the trench 902 extends to the bottom surface of the source/drain feature 610 as formed. In such embodiments, a portion of the substrate 202A may remain and/or the trench surface may be below (towards the backside) the layer 204. In an embodiment, the trenches 902 may be formed such that the termination of the trench 902 (i.e., point closest to the frontside of the structure) is coplanar with the bottom layer 204. In a further embodiment, the termination of the trench 902 is coplanar with a top surface of the bottom layer 204. In an embodiment, the termination of the trench 902 is below the lowest channel region 208, but above a bottom surface of the bottom layer 204.

In an embodiment of the method 100, the method 100 then proceeds to block 126 where a metal layer is deposited over the backside of the structure including in the trenches formed of block 122. (In other embodiments, the method 100 proceeds first to block 124 where a glue layer is deposited, as discussed below with reference to FIGS. 17A-21E. In some embodiments, block 124 is omitted.) Referring to the example of FIGS. 10A-10E, a conductive layer 1002 is deposited on the backside of the device 200. Exemplary materials for the conductive layer 1002 include TaN, Mo, Ni, W, Ru, Co, Cu, Ti, TiN, Ta, or combinations thereof. The conductive layer 1002 may be deposited by CVD, PVD, ALD, plating, and/or other suitable processes. Block 126 in some embodiments further includes performing a chemical mechanical polish (CMP) process after deposition of the conductive material.

The method 100 then proceeds to block 128 where a masking element is formed over the conductive layer aligned with the S/D feature for which a contact (backside contact) is desired. In an embodiment, the masking element is aligned with the S/D feature for which contact was not made on the frontside above in block 118. In an embodiment, the masking element includes photoresist. Referring to the example of FIGS. 11A-11E, a masking element 1102 is formed on the backside of the structure and aligned with a S/D feature 610 (e.g., to which a frontside contact was not made). The photolithography process to form the masking element may include forming a photoresist layer over the backside of the device 200, exposing the resist to a pattern, performing post-exposure bake processes, and developing the resist to form a masking element including the resist. In some embodiments, pattering the resist to form the masking element may be performed using an electron beam (e-beam) lithography process. The masking element may then be used to protect regions of the device 200, and in particular portions of the conductive layer 1002 aligned with certain of the S/D features 610.

The method 100 then proceeds to block 130 where the conductive layer is patterned according to masking element forming a via structure to S/D feature. Referring to the example of FIGS. 12A-12E, the conductive layer 1002 (of FIGS. 11A-11E) is patterned by etching to form the via structure 1202 according to the pattern of the masking element 1102. The via structure 1202 interfaces physically with the source/drain feature 610 and provides an electrical connection to the source/drain feature 610. It is noted that the etching process to cut the conductive layer 1002 is selective to the composition of the conductive layer 1002, and thus the bottom layer 204 acts as an etch stop. In some embodiments, the etching process can be suitably tuned for selectivity due to the difference in composition between the metal of conductive layer 1002 and the dielectric material of the bottom layer 204. Thus, in some embodiments, the loss of the bottom layer 204 during the etching is negligible in comparison to loss that may occur when etching, for example, a trench in a dielectric layer such as provided by block 134 below adjacent the bottom layer 204. The resultant via structure 1202 is a tapered structure having a bottom width (adjacent the backside of the structure) that is smaller than its width at interface with the bottom layer 204. The dimensions of the via structure 1202 are further discussed below with reference to FIG. 14B.

In an embodiment, the method 100 then proceeds to block 134 where a dielectric layer is deposited. (In an embodiment, the method 100 proceeds first to block 132 where a liner layer is deposited as discussed below with reference to FIGS. 15A-16E. In some embodiments however, block 132 is omitted.) Block 134 may further include a chemical mechanical polish (CMP) process after deposition of the dielectric layer to form the dielectric layer. Referring to the example of FIGS. 13A-13E, a dielectric layer 1302 is deposited on the backside of the structure including device 200. Exemplary materials for the dielectric layer 1302 include SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, and combinations thereof. In an embodiment, the dielectric layer 1302 has a thickness t1 between approximately 3 nm and approximately 50 nm.

The method 100 then proceeds to block 136 where a backside metallization layer is formed. The backside metallization layer may form a power rail. Referring to the example of FIGS. 14A-14E, the backside via structure 1202 is physically and electrically connected to the formed metallization layer 1402. In an embodiment, the metallization layer 1402 may be formed using a damascene process, a dual-damascene process, a metal patterning process, or other suitable processes. The metallization layer may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. The metallization layer 1402 may be embedded in one or more dielectric layers. Having metallization layer 1402 can in some embodiments increase the number of metal lines available in the device 200 for directly connecting to source/drain contacts and vias. In an embodiment, the metallization layer 1402 may have a thickness dl in a range from about 5 nm to about 40 nm. The metallization layer 1402 may be different in composition than S/D contact 712 and/or S/D contact via 716.

Figure 14B:
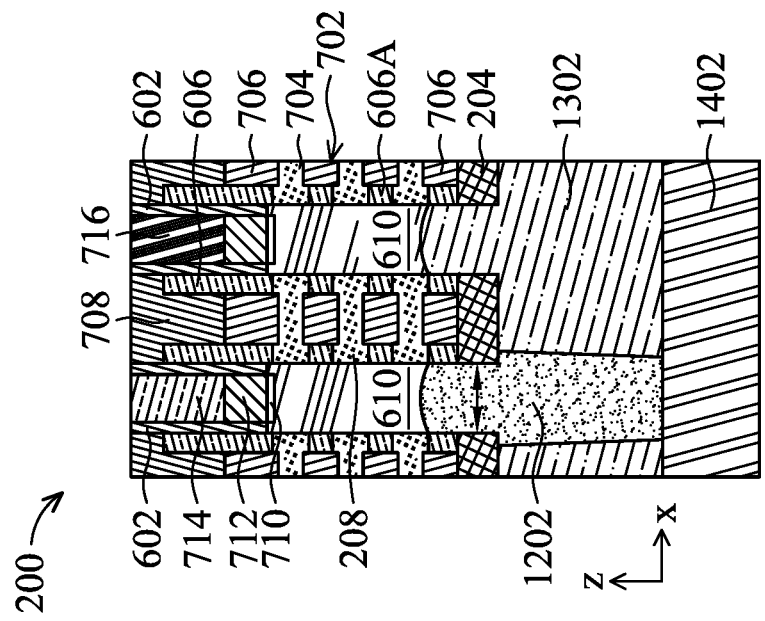
Figure 14A:
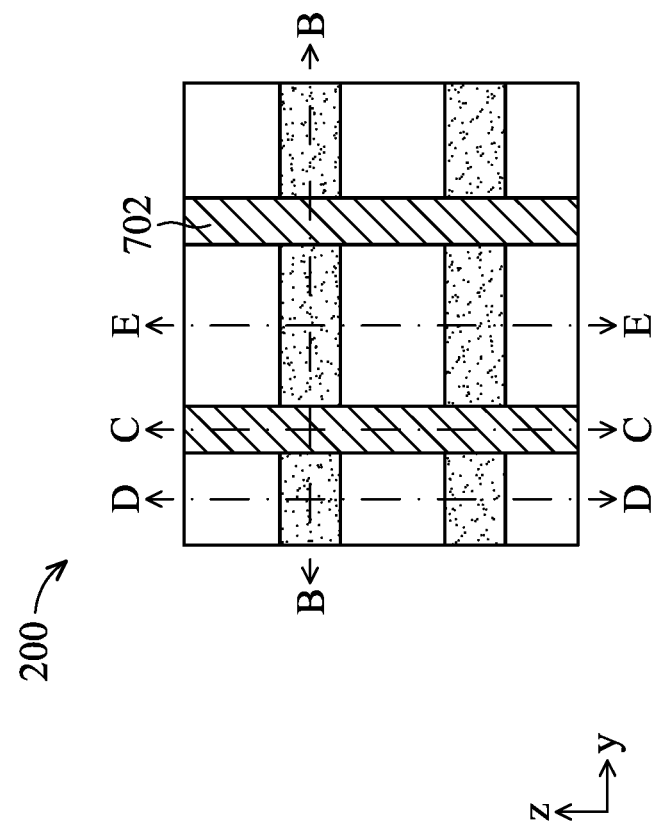
Figures 15A, 15B:
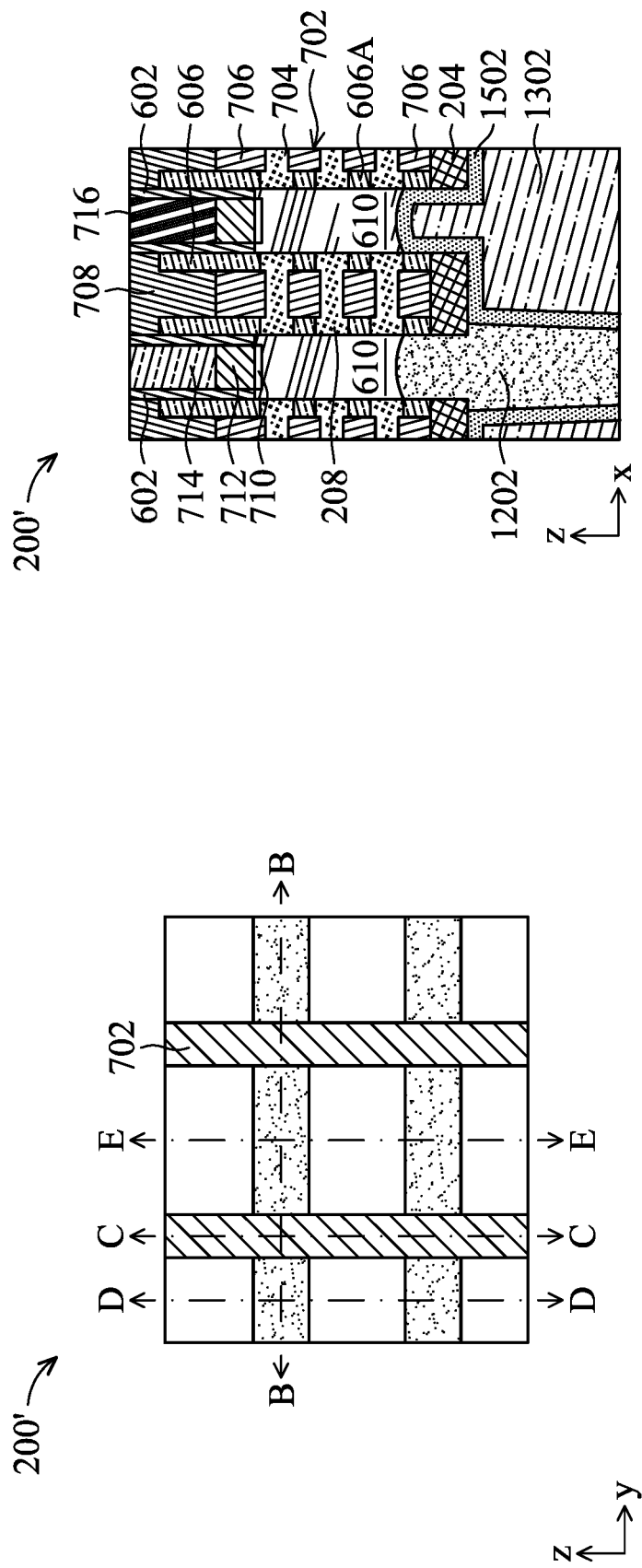
Figure 16B:
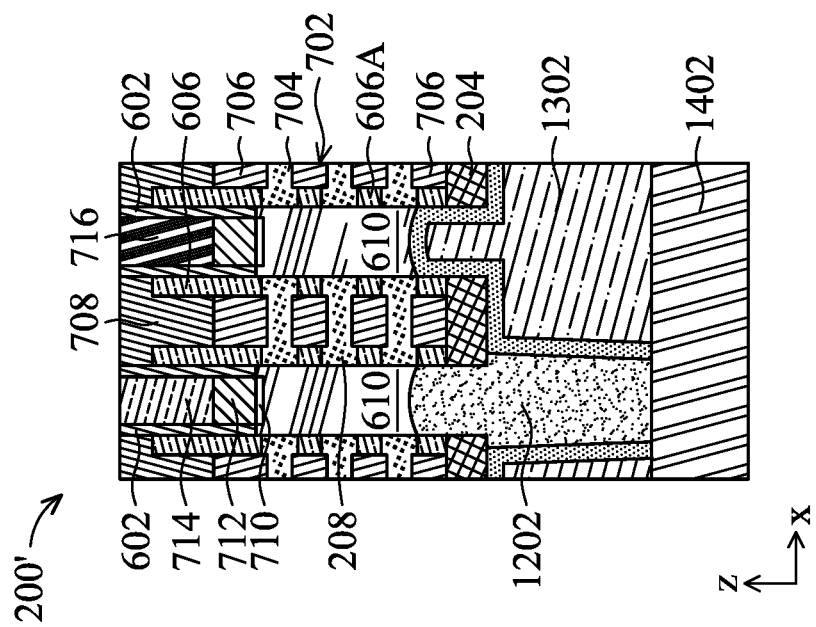
Figure 16A:
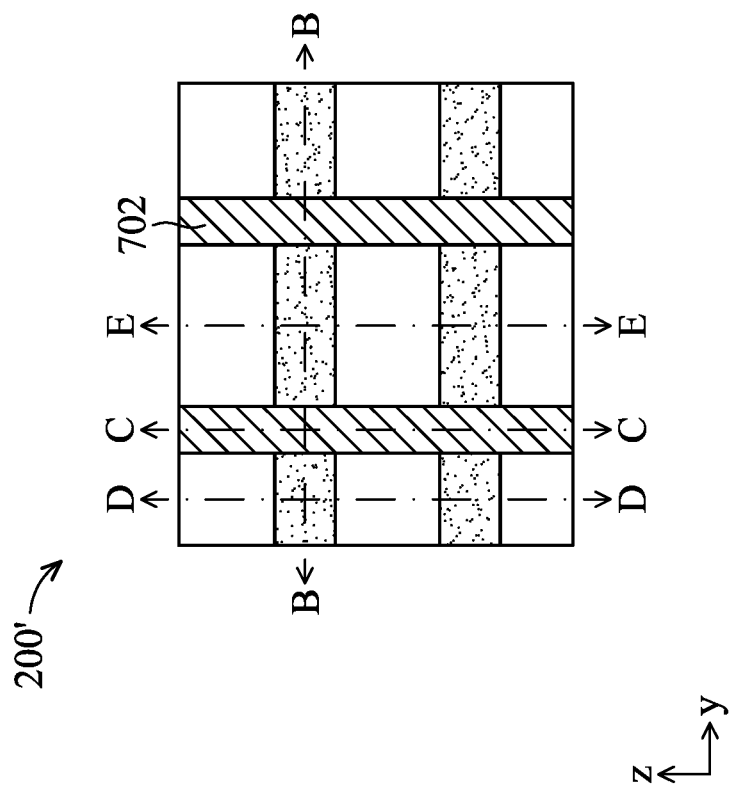
Figure 17B:
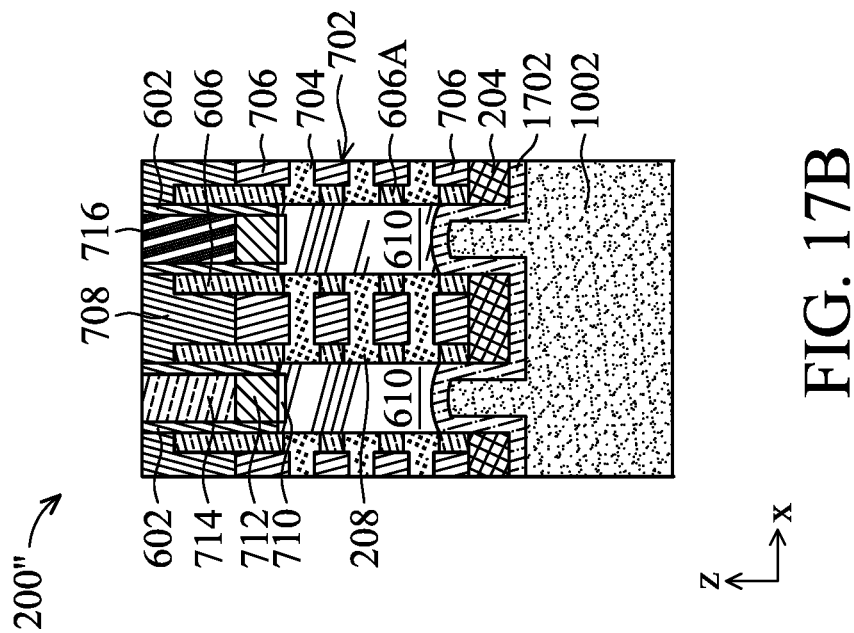
Figure 17A:
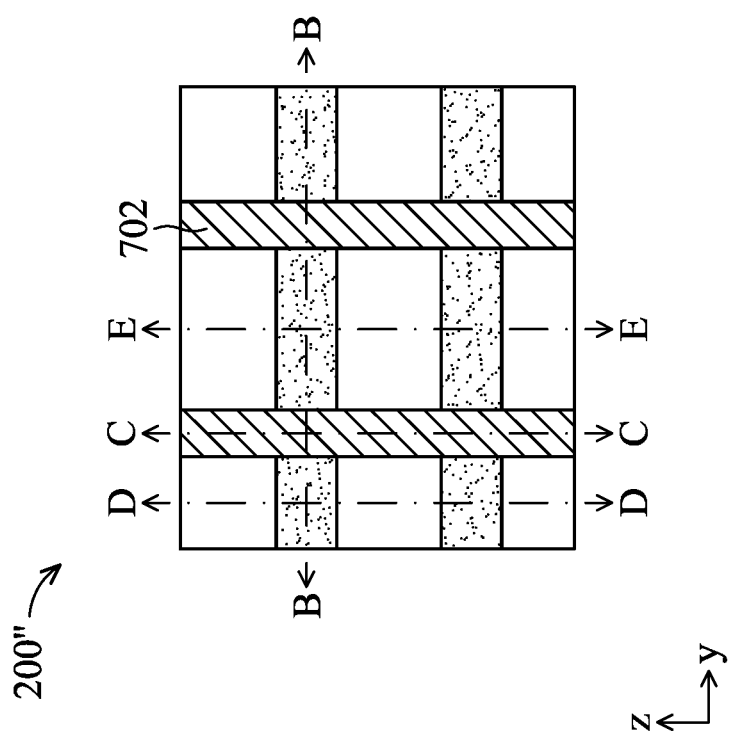
Figures 17C, 17D, 17E:
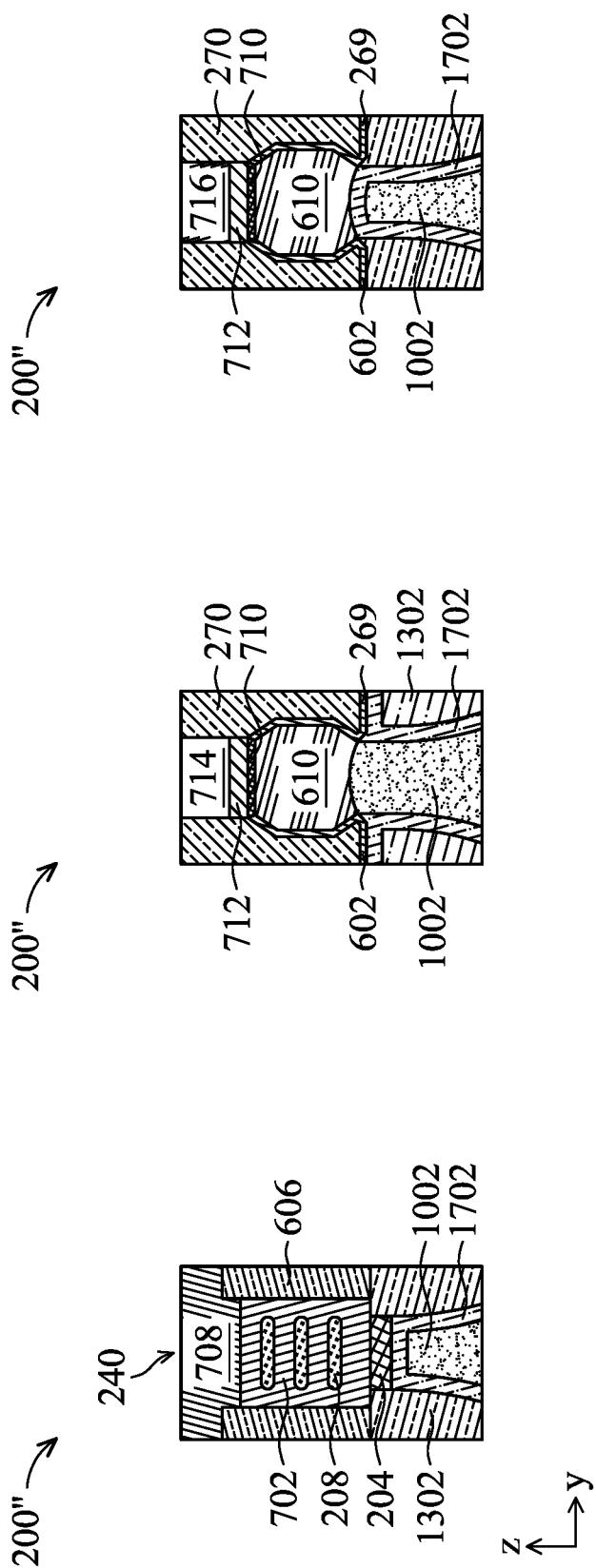
Figure 18B:
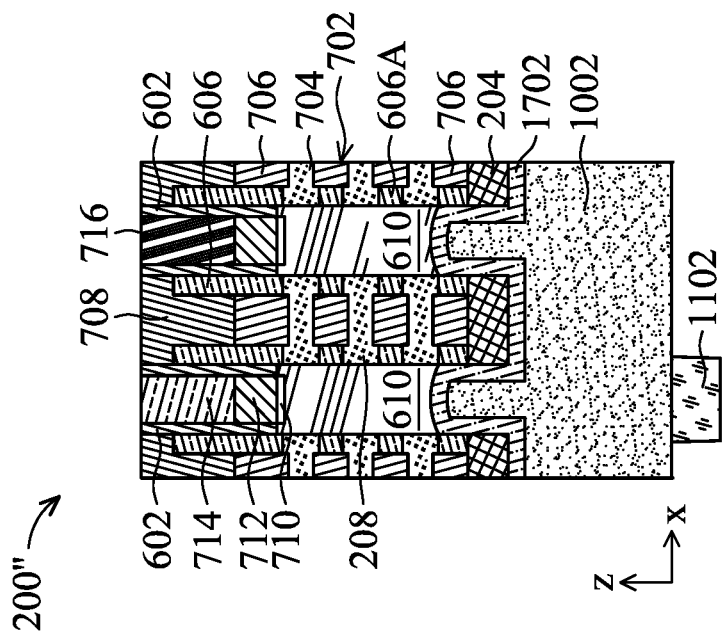
Figure 18A:
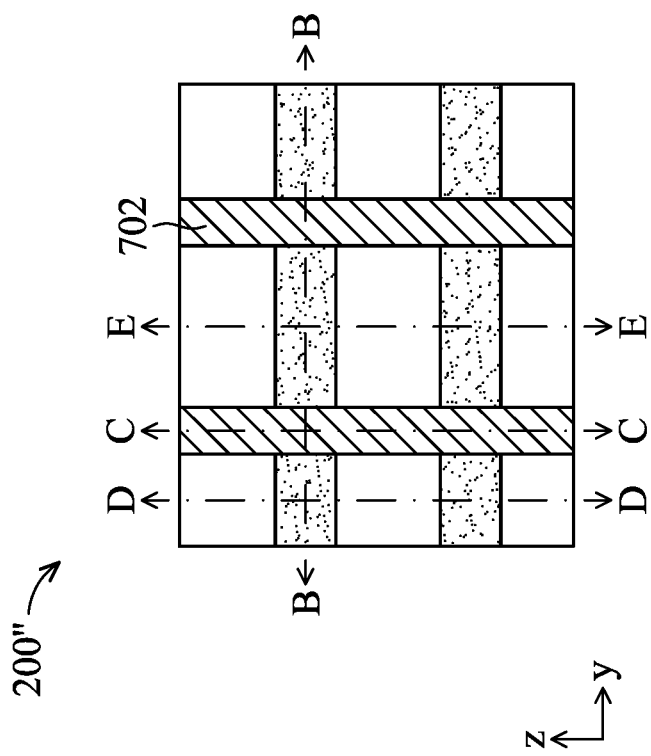
Figure 19B:
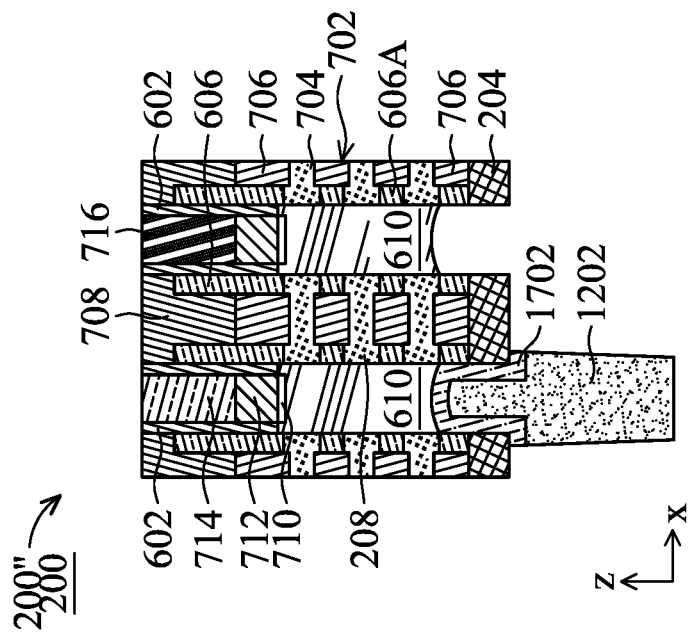
Figure 19A:
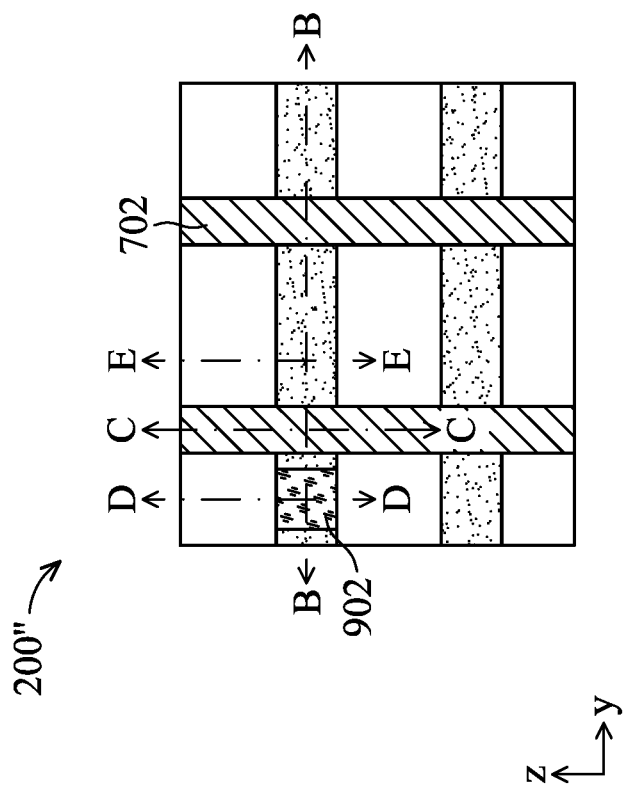
Figure 22B:
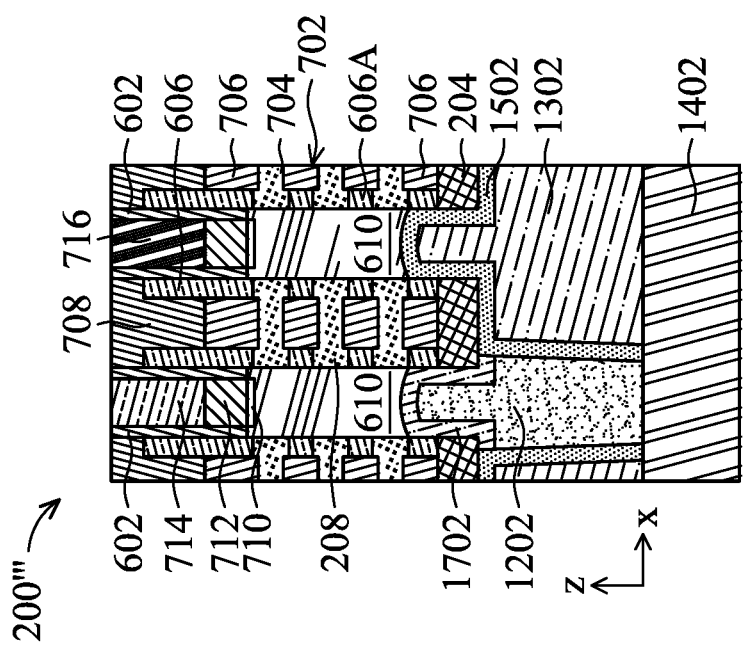
Figure 22A:
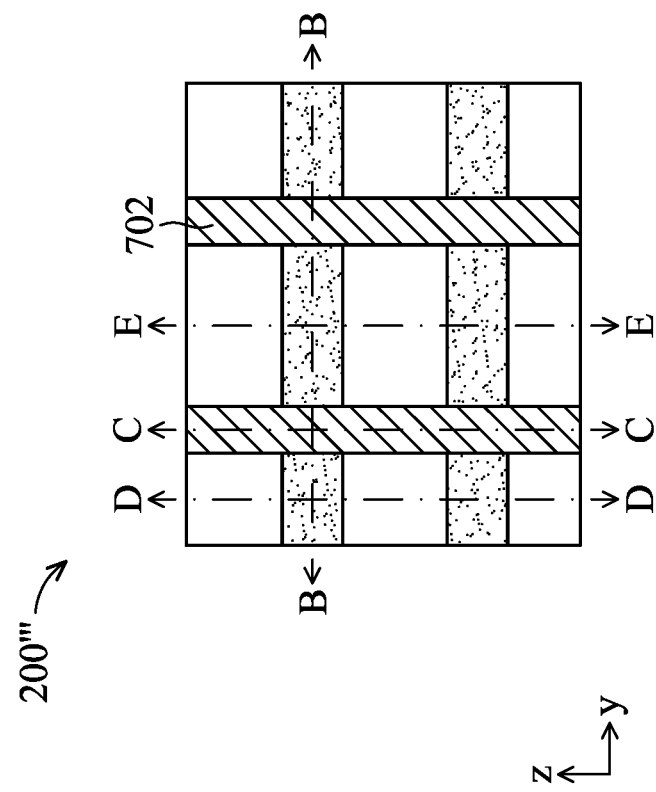

FIG. 14B is also illustrative of the tapered profile of the via structure 1202. The via structure 1202 has a first width w3 closer to the channel region of the device 200 and a second width w4 adjacent the backside of the structure and the metallization layer 1402. In some embodiments, the first width w3 is smaller than second width w4. In an embodiment, the first width w3 is at least approximately 5% smaller than the second width w4. In a further embodiment, the first width w3 is at least approximately 10% smaller than the second width w4. In some embodiments, the first width w3 is between approximately 3 and 30 nm. In some embodiments, the second width w4 is between approximately 3 and 27 nm. The via 1202 may further include a width w5 that is between 2 and 20 nm.

The method 100 then proceeds to block 138 where further fabrication processes may be performed. In some embodiments, further metallization routing is performed on the backside of the device.

As discussed above, in some embodiments of the method 100, block 132 is omitted. FIGS. 15A-16E illustrate exemplary embodiments of certain aspects of the method 100 including block 132 in exemplary device 200'. The method 100 proceeds substantially similar to as discussed above, however, after forming the conductive backside via, a liner layer is deposited in block 132 prior to the dielectric layer being formed in block 134. Referring to the example of FIGS. 15A-15E, which follows FIGS. 12A-12E, a liner layer 1502 is disposed on the device 200' having backside via structure 1202. Exemplary liner layer 1502 compositions include SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, and combinations thereof. The liner layer 1502 may be a different composition than that of the dielectric layer 1302. Exemplary thicknesses of the liner layer 1502 are between approximately 0.5 and 5 nm. Benefits of including the liner layer 1502 include possible improvement in adhesion and deposition (e.g., coverage) of the dielectric layer 1302. After deposition of the liner layer 1502, the dielectric layer 1302 is deposited substantially similar to as discussed above. In some embodiments, after deposition of the liner layer 1502 and the dielectric layer 1302, a CMP process is performed.

The method 100 then proceeds to block 136 where the backside metallization layer is formed substantially similar to as discussed above. Referring to the example of FIGS. 16A-16E, the metallization layer 1402 is formed substantially similar to FIGS. 14A-14E but including an interface with the liner layer 1502.

As discussed above, in some embodiments of the method 100, block 124 is omitted. FIGS. 17A-21E illustrate exemplary embodiments of certain aspects of the method 100 including block 124 illustrated in exemplary device 200". The method 100 proceeds substantially similar to as discussed above, however, following the processes of block 122 where trenches are etched over the backside of the structure (as illustrated in FIGS. 9A-9E), the method 100 proceeds to block 124 where a glue layer is deposited. Referring to the example of FIGS. 17A-17E, a glue layer 1702 is deposited on the backside of the structure including lining the trenches 902 of the device 200". Exemplary compositions of the glue layer 1702 include TaN, Mo, Ni, W, Ru, Co, Cu, Ti, TiN, Ta, and/or combinations thereof. In an embodiment, the glue layer 1702 has a thickness between approximately 0.5 nm to 5 nm. The glue layer 1702 may be a conformal layer.

After deposition of the glue layer in block 124, the method 100 proceeds substantially similarly to as discussed above. In block 126, a conductive layer is deposited on the backside of the substrate and directly on the glue layer. Referring to the example of FIGS. 17A-17E, the conductive layer 1002 is deposited on the glue layer 1702. The conductive layer 1002 is substantially similar to as discussed above. The method 100 then proceeds to blocks 128-138, which are illustrated by the examples of FIGS. 18A-18E, 19A-19E, 20A-20E, and 21A-21E and are substantially similar to as discussed above though the referenced figures illustrate the glue layer 1702. It is noted that the glue layer 1702 after the patterning of conductive material 1002 to form the conductive via 1202 has a horse-shoe or U-shape and does not extend down the sidewalls of the conductive via 1202.

In some embodiments of the method 100 both block 124 and block 132 are included and the glue layer and the liner layer are each respectively deposited during the method 100. FIGS. 22A-22E illustrate the resultant device 200''' when each of the glue layer 1702 and the liner layer 1502 are included in the device 200'''. The elements of FIGS. 22A-22E similarly annotated are substantially similar to as discussed above.

Although not intended to be limiting, embodiments of the present disclosure provide one or more of the following advantages. For example, embodiments of the present disclosure form a conductive layer that is subsequently patterned to form the conductive backside via, surrounding dielectric material is deposited after the conductive backside via is formed. This eliminates the need to form a via hole in the dielectric material and subsequently filling the via hole with conductive material. The etching of via conductive material by the present embodiments advantageously reduces the risk of unwanted damage to the bottom layer or gate structure that may result from etching the via hole in the dielectric material (e.g., etching dielectric material to form a via hole why avoiding etching a dielectric material of the bottom layer). Also, embodiments of the present disclosure form backside vias using a self-aligned process, which minimize the risks of misalignment of the backside vias (e.g., shorting the backside vias to nearby conductors including the gate stacks). Embodiments of the present disclosure can be readily integrated into existing semiconductor manufacturing processes.

In one example aspect, the present disclosure is directed to a method that includes providing a structure with a frontside and a backside, the structure including a gate-all-around transistor having a gate structure, a source structure and a drain structure formed on a frontside. The structure is selectively etched from the backside to form a first trench extending to expose the source structure and a second trench extending to expose the drain structure. A conductive layer is deposited over the backside of the structure and within the first trench and the second trench. The conductive layer is patterned to remove the conductive layer from the second trench and after the patterning, a dielectric layer is deposited in the second trench.

In a further embodiment, the method also includes forming a contact element to the gate structure and at least one of the source structure or the drain structure, the contact element extending from the frontside of the structure. In an embodiment, depositing the dielectric layer includes depositing a liner layer and depositing an insulating material over the liner layer. In an embodiment, depositing the dielectric layer includes depositing an insulating material. A chemical mechanical polish (CMP) is performed on the insulating material, where the CMP exposes a surface of the conductive layer within the first trench. In a further embodiment, a power rail interconnect line is formed on the exposed surface of the conductive layer within the first trench. In an embodiment, depositing the conductive layer includes depositing a glue layer and an overlying conductive material.

In yet another embodiment of the method, selectively etching the structure from the backside to form the first trench extending to expose the source structure includes etching a portion of epitaxial material of the source structure. In an embodiment, patterning the conductive layer includes forming a photoresist feature on the conductive layer on the backside of the structure and etching the conductive layer that is not protected by the photoresist feature. In a further embodiment, the etching the conductive layer includes stopping an etching process on a self-aligned contact layer disposed between the gate structure and the backside of the structure.

In another of the broader embodiments discussed herein, provided is a method that includes forming a bottom layer over a frontside of a substrate. A transistor is formed having a gate structure, a source feature and a drain feature. The gate structure overlies the bottom layer. A first contact structure is provided to at least one of the source feature or the drain feature from the frontside of the substrate. A second contact structure is provided to the other one of the source feature or the drain feature from a backside of the substrate. The second contact structure can extend through an opening in the bottom layer. The providing the second contact structure may include depositing a conductive material interfacing the bottom layer, patterning the conductive material to form the second contact structure interfacing a first region of the bottom layer, and after the patterning, depositing a dielectric layer on a second region of the bottom layer.

In a further embodiment, the method includes thinning the substrate before providing the second contact structure. In an embodiment, after the substrate is thinned, a first trench is etched from the backside of the substrate to expose the source feature and a second trench is etched from the backside of the substrate to expose the drain feature. In some embodiments, depositing the conductive material includes depositing the conductive material in each of the first trench and the second trench and the patterning the conductive material may include removing the conductive material from one of the first trench or the second trench. In some embodiments, the method also includes after depositing the dielectric layer, performing a chemical mechanical polish of the dielectric layer. In an embodiment, a backside power rail metallization line is formed on the dielectric layer interfacing the first contact structure.

In yet another example aspect, the present disclosure is directed to a semiconductor structure. The structure includes two source/drain (S/D) features and one or more channel semiconductor layers connecting the two S/D features. A gate structure engages the one or more channel semiconductor layers and interposes the two S/D features. A bottom dielectric layer is disposed below the gate structure and the one or more channel semiconductor layers. A first contact extends from above a first S/D feature of the two S/D features to the first S/D feature and a second contact extends from below a second S/D feature of the two S/D features to the second S/D feature. The second contact has a first width at one terminal end and a second width adjacent the bottom dielectric layer. The first width is less than the second width. A metal line is connected to the terminal end of the second contact.

In a further embodiment, the second contact of the structure includes a glue layer interfacing the second S/D feature and the bottom dielectric layer and the glue layer does not interface the metal line. In another embodiment, a dielectric layer surrounds the second contact and interfaces the bottom dielectric layer. In a further embodiment, the dielectric layer includes a liner layer, which interfaces the bottom dielectric layer. In an embodiment, the liner layer may interface a sidewall of the second contact.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a structure with a frontside and a backside, the structure including a gate-all-around transistor having a gate structure, a source structure and a drain structure formed on a frontside;
   selectively etching the structure from the backside of the structure to form a first trench extending to expose the source structure and a second trench extending to expose the drain structure;
   depositing a conductive layer over the backside of the structure and within the first trench and the second trench;
   patterning the conductive layer to remove the conductive layer from the second trench;
   after the patterning, depositing a dielectric layer in the second trench.

2. The method of claim 1, further comprising:
   forming a contact element to the gate structure and at least one of the source structure or the drain structure, the contact element extending from the frontside of the structure.

3. The method of claim 1, wherein the depositing the dielectric layer includes depositing a liner layer and depositing an insulating material over the liner layer.

4. The method of claim 1, wherein the depositing the dielectric layer includes:
   depositing an insulating material;
   performing a chemical mechanical polish (CMP) on the insulating material, wherein the CMP exposes a surface of the conductive layer within the first trench.

5. The method of claim 4, further comprising:
   forming a power rail interconnect line on the exposed surface of the conductive layer within the first trench.

6. The method of claim 1, wherein the depositing the conductive layer includes depositing a glue layer and an overlying conductive material.

7. The method of claim 1, wherein the selectively etching the structure from the backside of the structure to form the first trench extending to expose the source structure includes etching a portion of epitaxial material of the source structure.

8. The method of claim 1, wherein the patterning the conductive layer includes forming a photoresist feature on the conductive layer on the backside of the structure and etching the conductive layer that is not protected by the photoresist feature.

9. The method of claim 8, wherein the etching the conductive layer includes stopping an etching process on a self-aligned contact layer disposed between the gate structure and the backside of the structure.

10. A method, comprising:
    forming a bottom layer over a frontside of a substrate;
    forming a transistor having a gate structure, a source feature and a drain feature, wherein the gate structure overlies the bottom layer;
    providing a first contact structure to at least one of the source feature or the drain feature from the frontside of the substrate; and
    providing a second contact structure to the other one of the source feature or the drain feature from a backside of the substrate, wherein the second contact structure extends through an opening in the bottom layer, and wherein the providing the second contact structure includes:
       depositing a conductive material interfacing the bottom layer;
       patterning the conductive material to form the second contact structure interfacing a first region of the bottom layer; and
       after the patterning, depositing a dielectric layer on a second region of the bottom layer.

11. The method of claim 10, wherein before providing the second contact structure, the substrate is thinned.

12. The method of claim 11, wherein after the substrate is thinned, a first trench is etched from the backside of the substrate to expose the source feature and a second trench is etched from the backside of the substrate to expose the drain feature.

13. The method of claim 12, wherein the depositing the conductive material includes depositing the conductive material in each of the first trench and the second trench.

14. The method of claim 13, wherein the patterning the conductive material includes removing the conductive material from one of the first trench or the second trench.

15. The method of claim 10, further comprising: after depositing the dielectric layer, performing a chemical mechanical polish of the dielectric layer; and
    forming a backside power rail metallization line on the dielectric layer interfacing the first contact structure.

16. A semiconductor structure, comprising:
    two source/drain (S/D) features;
    one or more channel semiconductor layers connecting the two S/D features;
    a gate structure engaging the one or more channel semiconductor layers and interposing the two S/D features;
    a bottom dielectric layer below the gate structure and the one or more channel semiconductor layers;
    a first contact extending from above a first S/D feature of the two S/D features to the first S/D feature;
    a second contact extending from below a second S/D feature of the two S/D features to the second S/D feature, wherein the second contact has a first width at one terminal end and a second width adjacent the bottom dielectric layer, wherein the first width is less than the second width;

a metal line connected to the terminal end of the second contact.

17. The semiconductor structure of claim 16, wherein the second contact includes a glue layer interfacing the second S/D feature and the bottom dielectric layer, wherein the glue layer does not interface the metal line.

18. The semiconductor structure of claim 16, further comprising: a dielectric layer surrounding the second contact, wherein the dielectric layer interfaces the bottom dielectric layer.

19. The semiconductor structure of claim 18, wherein the dielectric layer includes a liner layer, the liner layer interfacing the bottom dielectric layer.

20. The semiconductor structure of claim 19, wherein the liner layer interfaces a sidewall of the second contact.

* * * * *